United States Patent
Sjölund et al.

(10) Patent No.: US 10,098,257 B2
(45) Date of Patent: Oct. 9, 2018

(54) DEVICE FOR SIGNATURE ADAPTATION AND OBJECT PROVIDED WITH DEVICE FOR SIGNATURE ADAPTATION

(71) Applicant: BAE Systems Hägglunds Aktiebolag, Örnsköldsvik (SE)

(72) Inventors: Peder Sjölund, Obbola (SE); Jussi Myllyluoma, Sollentuna (SE)

(73) Assignee: BAE Systems Hägglunds Aktiebolag, Örnsköldsvik (SE)

( * ) Notice: Subject to any disclaimer, the term of this patent is extended or adjusted under 35 U.S.C. 154(b) by 319 days.

(21) Appl. No.: 14/897,399

(22) PCT Filed: Jul. 2, 2014

(86) PCT No.: PCT/SE2014/050838
§ 371 (c)(1),
(2) Date: Dec. 10, 2015

(87) PCT Pub. No.: WO2015/005852
PCT Pub. Date: Jan. 15, 2015

(65) Prior Publication Data
US 2016/0135330 A1     May 12, 2016

(30) Foreign Application Priority Data
Jul. 9, 2013    (SE) .................................... 1350855-1

(51) Int. Cl.
*H05K 7/20* (2006.01)
*B63G 13/02* (2006.01)
(Continued)

(52) U.S. Cl.
CPC ......... *H05K 7/20263* (2013.01); *B63G 13/02* (2013.01); *F41H 3/00* (2013.01); *G05D 23/1917* (2013.01)

(58) Field of Classification Search
CPC ........... G05D 23/1917; H05K 7/20263; B63G 13/02; F41H 3/00
See application file for complete search history.

(56) References Cited

U.S. PATENT DOCUMENTS

| 5,143,007 A | 9/1992 | Laukien et al. |
| 7,215,275 B2 | 5/2007 | Dumas |

(Continued)

FOREIGN PATENT DOCUMENTS

| CN | 102308178 A | 1/2012 |
| CN | 103033089 A | 4/2013 |

(Continued)

OTHER PUBLICATIONS

Office Action Received for Chinese Patent Application No. 201480034355.0, dated Jun. 15, 2017, 13 Pages (4 pages of English Translation and 9 pages of Official Copy).

(Continued)

*Primary Examiner* — Yasser A Abdelaziez
(74) *Attorney, Agent, or Firm* — Morrison & Foerster LLP

(57) ABSTRACT

The invention pertains to a device for signature adaptation, comprising a surface element arranged to assume a determined thermal distribution, wherein said surface element comprises at least one temperature generating element arranged to generate at least one predetermined temperature gradient to a portion of a first heat conducting layer of said surface element, characterized in that said device for signature adaptation comprises a liquid cooling element arranged to provide at least one liquid flow, thermally contacting an inner portion of said at least one temperature generating element so that thermal energy is dispersed from said at least one temperature generating element.

24 Claims, 15 Drawing Sheets

(51) Int. Cl.
*F41H 3/00* (2006.01)
*G05D 23/19* (2006.01)

(56) References Cited

U.S. PATENT DOCUMENTS

| | | |
|---|---|---|
| 2008/0190586 A1 | 8/2008 | Robinson et al. |
| 2014/0111364 A1 | 4/2014 | Sjolund |
| 2014/0125506 A1 | 5/2014 | Sjolund |
| 2016/0124443 A1* | 5/2016 | Reda .................. G05D 23/1917 700/282 |

FOREIGN PATENT DOCUMENTS

| | | |
|---|---|---|
| JP | 1-95994 A | 4/1989 |
| SE | 536136 C2 | 5/2013 |
| SE | 536137 C2 | 5/2013 |
| WO | 2010/093323 A1 | 8/2010 |
| WO | 2012/169954 A1 | 12/2012 |
| WO | 2015/005852 A1 | 1/2015 |

OTHER PUBLICATIONS

Office Action received for Chinese Patent Application No. 201480034355.0, dated Oct. 25, 2016, 16 Pages (7 pages of English Translation and 9 pages of Official Copy).

Written Opinion received for Singapore Patent Application No. 11201509654V, dated Oct. 20, 2016, 7 pages.

International Preliminary Report on Patentability received for PCT Patent Application No. PCT/SE2014/050838, dated Jan. 21, 2016, 8 pages.

International Search Report and Written Opening for PCT Application No. PCT/SE2014/050838, dated Sep. 30, 2014, 12 pages.

Extended European Search Report (includes Supplementary European Search Report and European Search Opinion) received for European Patent Application No. 14823496.6, dated Jan. 23, 2017, 9 pages.

* cited by examiner

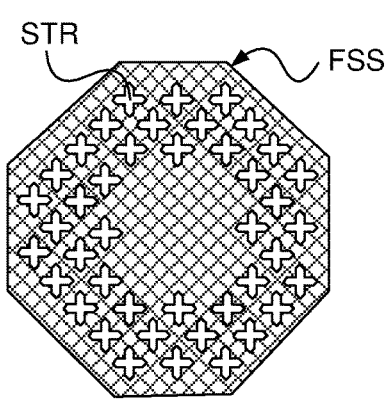
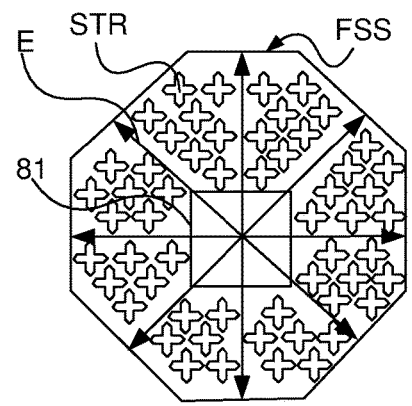
Fig. 8c            Fig. 8d
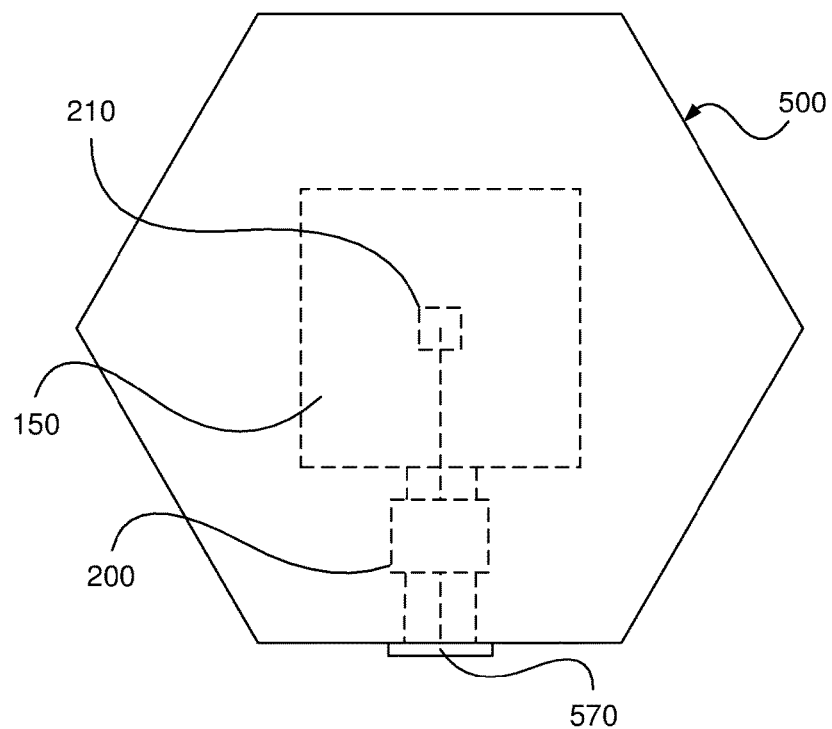
Fig. 9

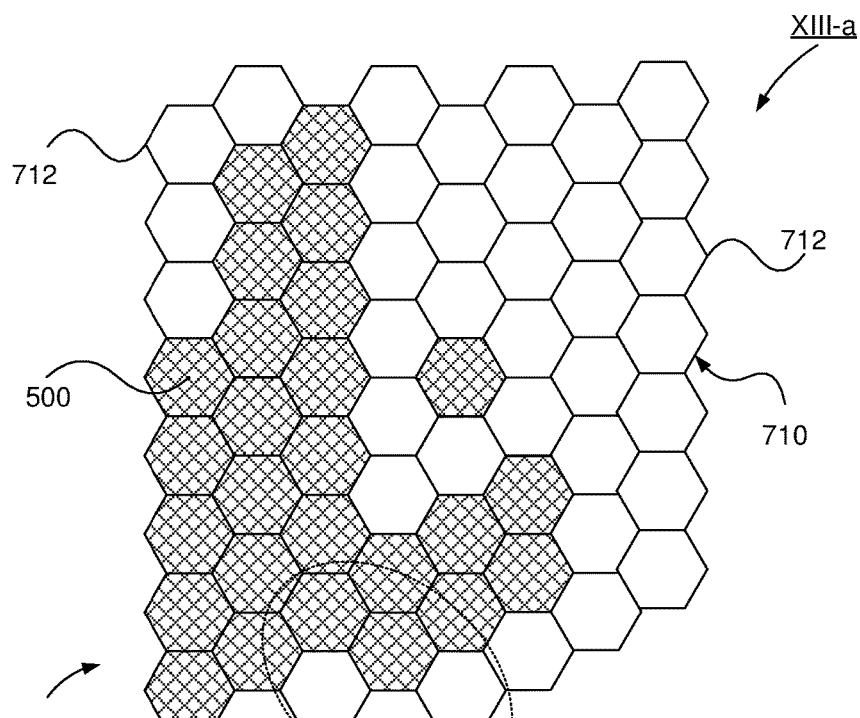
Fig. 11a
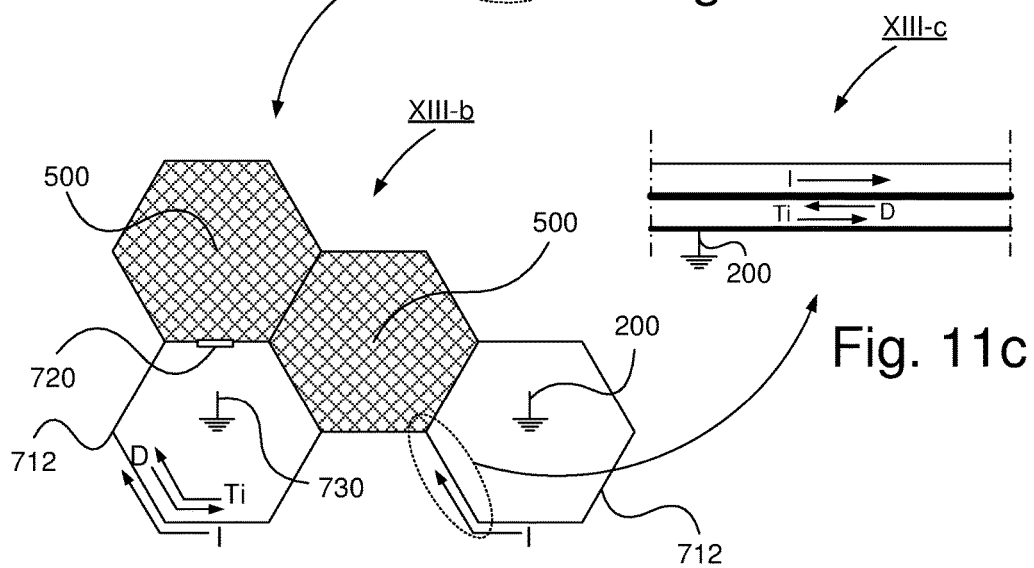
Fig. 11b
Fig. 11c

DEVICE FOR SIGNATURE ADAPTATION AND OBJECT PROVIDED WITH DEVICE FOR SIGNATURE ADAPTATION

CROSS REFERENCE TO RELATED APPLICATIONS

This application is a U.S. National Stage patent application of PCT/SE2014/050838, filed on Jul. 2, 2014, which claims priority to Swedish Patent Application No. 1350855-1, filed on Jul. 9, 2013, the entire contents of which are incorporated herein by reference.

FIELD OF THE INVENTION

The present invention pertains to a device for signature adaptation. The present invention also pertains to an object such as a craft.

BACKGROUND OF THE INVENTION

Military vehicles/crafts are subjected to threats, e.g. in a situation of war, wherein they constitute targets for attacks from land, air and sea. It is therefore desired that the vehicle is as difficult as possible to detect, classify and identify. For this purpose military vehicles are often camouflaged with regard to the background so that they become difficult to detect, classify and identify by means of using the bare eye. Furthermore, they are difficult to detect in darkness with different types of image intensifiers. A problem is that attacking crafts such as combat vehicles and aircrafts are often equipped with a combination of one or more active and/or passive sensor systems comprising radar and electro-optical/infrared (EO/IR) sensors whereby the vehicles/crafts becomes relatively easy targets to detect, classify and identify. Users of such sensor systems search for a particular type of thermal/reflecting contour which is not normally occurring in nature, usually different edge geometries, and/or large evenly heated surfaces and/or evenly reflecting surfaces.

In order to provide protection against such system different types of technologies within the field of signature adaptation are used today. Signature adaptation technologies comprises constructional actions and are often combined with advanced materials technology in order to provide a specific emitting and/or reflecting surface of the vehicles/crafts in all wave length areas wherein such sensor system operate.

U.S. Pat. No. 7,215,275 B2 describes an apparatus for adaptive camouflage with independent control of both temperature and apparent color. The apparatus has cells or individual pixels behind a transparent outer layer. The temperature of the outer layer is controlled by a heat transfer fluid flowing in a closed circuit in each cell, the fluid being cooled or heated by Pelletier elements located behind the assembly. Color changes can be activated separately at the back of the transparent layer by the rotation of metallic triangles whose sides are covered with various color paints, the triangles being located behind the transparent layer. The apparent signature of the assembly can then be varied by adapting the signature of the various cells to current environmental conditions when background conditions alter. This solution has the drawback of that it provides a slow response time for adapting the thermal signature. Furthermore it is difficult to a good resolution of the thermally adapting structure without the use of excessive amount of pipes for transporting the fluid.

WO/2010/093323 A1 describe a device for thermal adaptation, comprising at least one surface element arranged to assume a determined thermal distribution, said surface element comprising a first heat conducting layer, a second heat conducting layer, said first and second heat conducting layers being mutually thermally isolated by means of an intermediate insulation layer, wherein at least one thermoelectric element is arranged to generate a predetermined temperature gradient to a portion of said first layer. The invention also relates to an object such as a craft. This solution only enables thermal signature adaptation and is not suitable for implementation in objects such as vehicles/crafts, which of constructional reasons do not enable storage of excess heat provided from said at least one thermoelectric element.

SUMMARY OF THE INVENTION

An object of the present invention is to provide a device for signature adaptation that manages thermal signature adaptation and that is suitable for implementation in vehicles/crafts, such as marine crafts.

An additional object of the present invention is to provide a device for signature thermal signature adaptation that enables achieving of active thermal camouflage with desired thermal structure.

An additional object of the present invention is to provide a device for thermal and radar/visual camouflage that enables achieving of an automatic thermal adaptation of the surroundings and active visual adaptation and/or passive radar adaptation and which enables achieving an un-even thermal/visual structure.

Another object of the present invention is to provide a device for thermally mimicking e.g. other vehicles/crafts in order to provide thermal and visual identification of own troops by means of thermal and/or radar signature or to provide opportunities for infiltration by means of thermal or radar signature adaptation in or around e.g. enemy troops during suitable circumstances.

These and other objects, apparent from the following description, are achieved by a device for signature adaptation and an object that exhibits the features recited below. Preferred embodiments of the device are defined below.

According to the invention the objects are achieved by a device for signature adaptation, comprising a surface element arranged to assume a determined thermal distribution, wherein said surface comprises at least one temperature generating element arranged to generate at least one predetermined temperature gradient to a portion of a first heat conducting layer of said surface element, wherein said device for signature adaptation comprises a liquid cooling element arranged to provide at least one liquid flow, thermally contacting an inner portion of said at least one temperature generating element so that thermal energy is disposed from said at least one temperature generating element.

Hereby is enabled an effective thermal adaptation where implementation is possible for objects comprising a surface structure, such as for example a surface structure comprising sandwich material, which is commonly occurring in marine crafts. A particular application of the present invention is thermal adaptation for camouflage of for example military vehicles/crafts, wherein said at least one temperature generating element enables effective thermal adaptation so that dynamic thermal signature adaptation can be maintained during movement of the vehicle.

According to an embodiment of the device said liquid cooling element is configured for coupling to at least one pump arranged to provide said at least one liquid flow to said liquid cooling element.

According to an embodiment of the device said surface element comprises a plurality of temperature generating element, each arranged to generate at least one predetermined temperature gradient to a respective portion of said first heat conducting layer of said surface element. This enables rapid and effective adaptation of a larger surface which means that the surface elements may be constructed to be larger alternatively thermal adaptation for smaller surface elements can take place quicker.

According to an embodiment of the device said liquid cooling element comprises a liquid cooling element layer, being comprised as a portion of the liquid cooling element and wherein said liquid cooling element layer is arranged inwardly of said first heat conducting layer, wherein said liquid cooling element layer comprises a plurality of apertures arranged to receive a plurality of temperature generating elements so that said plurality of temperature generating elements thermally contacts a portion of a heat plate structure, arranged inwardly of and facing said liquid cooling element layer and arranged to disperse the heat from said plurality of temperature generating element in direction along the surface of the heat plate structure.

According to an embodiment of the device said liquid cooling element comprises a liquid cooling plate and wherein said liquid cooling plate is arranged thermally contacting and facing a portion of said heat plate structure.

According to an embodiment of the device said plurality of apertures of the liquid cooling element layer are arranged in a geometric pattern in the form of a plurality of columns and wherein said heat plate structure comprises a plurality of heat plates, arranged to face the liquid cooling element layers so that each of the respective heat plates overlap a column of said plurality of columns of apertures of the liquid cooling element.

According to an embodiment of the device the heat plate structure comprises a transversal heat plate arranged to thermally contact a central portion of each respective heat plate of said plurality of heat plates and wherein said liquid cooling plate is arranged facing said transversal heat plate.

According to an embodiment of the device said liquid cooling element is configured for coupling to said at least one pump via at least one conduit arranged for transport of said at least one liquid flow.

According to an embodiment of the device said at least one liquid flow comprises at least one cooling medium.

According to an embodiment of the device said at least one cooling medium comprises water.

According to an embodiment of the device said liquid cooling element is arranged to be supplied with said at least one liquid flow from at least one reservoir comprising cooling medium.

According to an embodiment of the device said at least one reservoir is comprised of ocean- or sea-water.

According to an embodiment of the device said surface element comprises at least one sub-display surface arranged to radiate at least one predetermine spectrum. By means of said surface element being provided with a display surface arranged to radiate at least one predetermined spectrum it is enabled provide camouflage within the visual area e.g. the area visible for the human eye apart from providing camouflage within the infrared area of the total electromagnetic spectrum.

According to an embodiment of the device said display surface comprises a plurality of sub-display surfaces, wherein said sub-display surfaces are arranged to radiate at least one predetermined spectrum in at least one predetermined direction, wherein said at least one predetermined spectrum is directional dependent. By means of radiating at least one predetermined spectrum in multiple directions it is enabled to correctly reproduce perspective of visual background objects by means of reproducing different spectrum (pattern, colour) in different direction which means that a viewer independent from relative position sees a correct perspective of said visual background object.

According to an embodiment of the device said at least one predetermined direction for each sub-display surface is individually displaced relative to an orthogonal axis of said display surface. By means of providing a plurality of sub-display surfaces it is enabled to reproduce a plurality of directional dependent spectrums using one and the same display surface since each sub-display surface can be individually controlled.

According to an embodiment of the device said at least one display surface comprises an obstructing layer arranged to obstruct incident light of selected angles of incidence and an inwardly arranged curved reflecting layer arranged to reflect incident light. By means of providing an obstructing layer in combination with an inwardly arranged curved reflecting layer it is enabled to reproduce multiple directional dependent spectrums by means of using one and the same display surface in a cost efficient fashion. Said obstructing layer could for example easily be constructed of flexible thin film. It is further enabled that spectrums intended to be reproduced in a particular angle or angular range becomes invisible from particular viewing angles falling outside of said angle or angular range, as a result of using said obstructing layer.

According to an embodiment of the device the surface element comprises at least one additional element arranged to provide radar suppression. By means of said surface element being provided with an element arranged to provide radar suppression it is also enabled to provide camouflage within the area within which radar systems operate apart from providing camouflage within the infrared area of the total electromagnetic spectrum.

According to an embodiment of the device said surface element comprises an additional armour element arranged to provide armour. By providing at least one additional element arranged to provide armour it is facilitated apart from increasing the robustness to provide a device forming a modular armour system wherein individual forfeited surface elements of crafts easily can and cost efficiently can be replaced.

According to an embodiment of the device said first heat conducting layer has anisotropic heat conduction such that heat conduction mainly occurs in the main direction of propagation of the layer. By means of the anisotropic layer a quick and efficient transport of heat is facilitated and consequently quick and efficient adaptation. By increasing ratio between heat conduction in the main direction of propagation of the layer and heat conduction crosswise to the layer it is facilitated to arrange the thermoelectric elements at a larger distance from each other in a device with e.g. several interconnected surface elements, which results in a cost efficient composition of surface elements. By increasing the ratio between the heat conductibility along the layer and the heat conductibility crosswise to the layer the layers may be made thinner and still achieve the same efficiency, alternatively make the layer and thus the surface element quicker. If the layers become thinner with retained efficiency, they also become cheaper and lighter. Furthermore it is facilitated a more even distribution of heat in layers arranged directly underneath the display surface which heavily reduces the possibility that potential hot-spots of underlying layers affects the ability of said display surface to correctly reproduce spectrums.

According to an embodiment of the device said surface element comprises an intermediate heat conducting element arranged inwardly of and facing the temperature generating element, wherein the intermediate heat conducting layer has anisotropic heat conduction such that heat conduction mainly occurs in the main direction of propagation of the first heat conducting layer. This facilitated quick and effective transport of heat energy from the temperature generating element down towards underlying layers/structures such as down towards the liquid cooling plate via the heat plate structure.

According to an embodiment of the device said surface element has a hexagonal shape. This facilitates simple and general adaption and assembly during composition of surface elements to a module system. Further an even temperature may be generated on the entire hexagonal surface, wherein local temperature differences which may occur in corners of e.g. a squarely shaped module element are avoided.

According to an embodiment of the device said device further comprises thermal sensing means arranged to sense temperature of the surroundings, such as for example thermal background. This provides information for adaptation surface temperature of surface elements. A thermal sensing means such as an IR-camera provides an almost perfect adaptation of the thermal structure of the background, temperature variations may be reproduced representable on e.g. a vehicle arranged with several interconnected surface elements. The resolution of the IR-camera may be arranged to correspond to the resolution being representable by the interconnected surface elements, i.e. that each surface element corresponds to a number of grouped camera pixels. Hereby a very good representation of the background temperature is achieved such that e.g. heating of the sun, spots of snow, pools of water, different properties of emission etc. of the background often having another temperature than the air may be represented correctly. This efficiently counteracts that clear contours and evenly heated surfaces are created such that when the device is arranged on a vehicle a very good thermal camouflaging of the vehicle is facilitated.

According to an embodiment the device further comprises visual sensing means arranged to sense the visual background of the surroundings e.g. visual structure. This provides information for adaptation of radiated at least one spectrum from said at least one display surface of surface elements. Visual sensing means such as a video camera provides an almost perfect adaptation with respect to the background, wherein the visual structure of a background (colour, pattern) may be reproduced on e.g. a vehicle arranged with several interconnected surface elements.

According to an embodiment of the device the device comprises a plurality of surface elements, wherein the liquid cooling element of each of said plurality of surface elements are connected in parallel to at least one conduit for inflow of said at least one liquid flow and to at least one conduit for outflow of said at least one liquid flow. Hereby is facilitated rapid and effective cooling of the temperature generating elements of said plurality of surface elements while using a minimal number of conduits for liquid flow.

According to an embodiment of the device the device comprises framework or support structure, wherein the framework or support structure is arranged to support a plurality of interconnected surface elements and to provide power and/or control signals/communication to said plurality of interconnected surface elements. By means of that the framework in itself is arranged to supply power the number of cables may be reduced.

BRIEF DESCRIPTION OF THE DRAWINGS

A better understanding of the present invention will be had upon the reference to the following detailed description when read in conjunction with the accompanying drawings, wherein like reference characters refer to like parts throughout the several views, and in which:

FIG. 1b schematically illustrates an exploded side view of different layers of part of the device in FIG. 1a;

FIG. 8c schematically illustrates a plan view of different layers of part of a device according to an embodiment of the present invention;

FIG. 8d schematically illustrates a plan view of flows in different layers of part of a device according to an embodiment of the present invention;

FIG. 9 schematically illustrates a plan view of a device according to an embodiment of the present invention;

FIG. 11a schematically illustrates a plan view of a module system comprising elements for recreating of thermal background or similar;

FIG. 11b schematically illustrates an enlarged part of the module system in FIG. 11a;

FIG. 11c schematically illustrates an enlarged part of the part in FIG. 11b;

FIG. 12b schematically illustrates an exploded side view of a partially cut perspective view of the module system in FIG. 12a;

DETAILED DESCRIPTION OF THE INVENTION

Figure 1A:
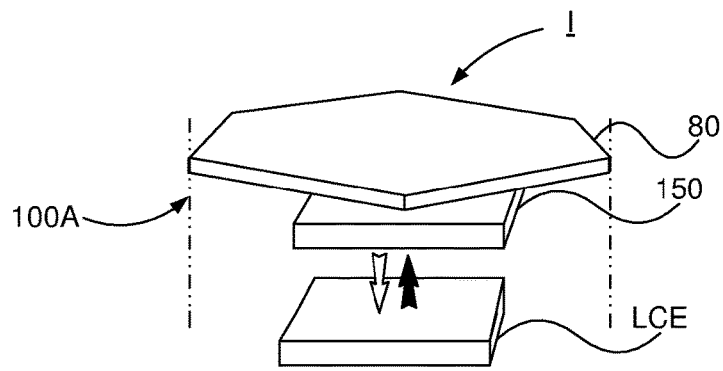
FIG. 1a schematically illustrates an exploded perspective view of different layers of a device according to an embodiment of the present invention.

Herein the term "link" is referred to as a communication link which may be a physical line, such as an opto-electronic communication line, or a non-physical line, such as a wireless connection, e.g. a radio link or microwave link.

By radio waves in the embodiments according to the present invention described below is intended radio waves within the electromagnetic spectrum that are typically utilized by radar system. The above mentioned radio waves may also refer to pulses of radio waves or micro waves By temperature generating element in the embodiments according to the present invention described below is intended an element by means of which a temperature may be generated.

By thermoelectric element in the embodiments according to the present invention described below is intended an element by means of which Peltier effect is provided when voltage/current is applied thereon.

The terms temperature generating element and thermoelectric element are used interchangeably in the embodiments according to the present invention to describe an element by means of which a temperature may be generated. Said thermoelectric element is intended to refer to an exemplary temperature generating element.

By spectrum in the embodiments according to the present invention described below is intended one or more frequencies or wavelengths of radiation produced by one or more light sources or one or more light reflecting surfaces. Thus, the term spectrum is intended to refer to frequencies or wavelengths not only in the visual area both also within the infrared, ultra-violet or other areas of the total electromagnetic spectrum. Further a given spectrum may be of a narrow-band or wide-band type e.g. comprises a relatively small number of frequency/wavelength components or comprises a relatively large number of frequency/wavelength components. A given spectrum may also be the results of a mix of a plurality of different spectrums i.e. comprise a plurality of spectrums radiated from a plurality of light sources or a plurality of light reflecting surfaces.

By colour in the embodiments according to the present invention described below is intended a property of radiated light in terms of how an observer perceive the radiated light. Thus, different colours implicitly refer to different spectrums comprising different frequency/wavelength components.

Thermal camouflage systems that are based on thermoelectric elements according to known technology typically comprise some form of heat exchanger functionality. This since thermoelectric elements risks saturation during operation if sufficient cooling is not available.

According to WO/2010/093323 A1 this heat exchanger functionality is comprised of passive in the form of using the heat conductivity of the material of the object on which the signature adaptation device is arranged to be mounted. In more detail the chassis/hull of the objects on which the signature adaptation device is arranged to be mounted is used for storage of excess heat generated by thermoelectric elements. This however stipulates that the surface material of the object has sufficient heat conducting characteristics. Thus, a problem with known technique is that it is not suitable to implement of objects that have surface material in the form of material with poor heat conducting characteristics. This is particularly the case for objects such as vehicles/crafts who's hull/chassis comprises material with poor heat conductivity, such as marine crafts that has hulls comprising sandwich material, such as sandwich material with a core of polyvinylchloride (PVC) coated with carbon fiber laminate.

FIG. 1a schematically illustrates an exploded perspective view of a part I of a device for signature adaptation according to an embodiment of the present invention.

Figure 1B:
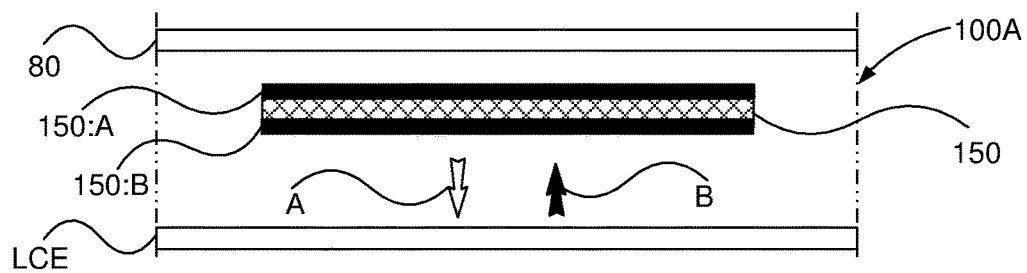

FIG. 1b schematically illustrates an exploded view of the part I of the device for signature adaptation according to an embodiment of the present invention.

The device for signature adaptation comprises at least one surface element 100A, Said at least one surface element 100A comprises at least one temperature generating element 150 arranged to generate at least one predetermined temperature gradient. Said at least one temperature generating element 150 is arranged to generate said at least one predetermined temperature gradient to a portion of said at least one surface element 100. In more detail an outer surface 150:A of said at least one temperature generating element 150 is arranged to generate said at least one predetermined temperature gradient to a portion of said surface element 100A. Said at least one surface element 100A further comprise at least one liquid cooling element LCE configured for thermal contact with said at least one temperature generating element 150. In more details said at least one liquid cooling element is configured for thermal contact with an inner surface 150:B of said at least one temperature generating element 150. By means of that said at least one liquid cooling element is configured for thermal contact with an inner surface 150:B of said at least one temperature generating element 150 it is facilitated to transport heat away from said inner surface of said at least one temperature generating element 150 and to provide cooling to said inner surface of said at least one temperature generating element 150, as illustrated with continued reference to FIG. 1b, wherein heat transport is illustrated with white arrows A or non-filled arrows A and wherein transport of cold is illustrated with black arrows B or filled arrows B, transport of cold physically implies diversion of heat having the opposite direction to the direction for transport of cold.

According to an embodiment said surface element 100A comprises a first heat conducting layer 80. According to this embodiment said at least one temperature generating element 150 is arranged facing an inner portion of said first heat conducting layer 80. By means of that said at least one temperature generating element 150 is arranged facing a portion of a layer that is heat conducting, in the form of said at least one first heat conducting layer 80, it is facilitated that the predetermined temperature gradient is dispersed over the surface of the first heat conducting layer 80 so as to thereby provide an adapted thermal signature exterior to the surrounding. According to this embodiment said outer surface 150:A of said at least one temperature generating element 150 is arranged to face an inner portion of the first heat conducting layer 80.

The temperature generating element 150 is according to an embodiment comprised of at least one thermoelectric element.

The thermoelectric element 150 is according to an embodiment a semiconductor functioning according to the Peltier effect. The Peltier effect is a thermoelectric phenomenon arising when a dead current is allowed to float over different metals or semiconductors. In this way a heat pump cooling one side of the element and heating the other side may be created. The thermoelectric element comprises two ceramic plates with high thermal conductivity. The thermoelectric element according to this variant further comprises semiconductor rods which are positively doped in one end and negatively doped in the other end such that when a current is flowing though the semiconductor, electrons are forced to stream such that one side becomes hotter and the other side colder (deficiency of electrons). During change of direction of current, i.e. by changed polarity of the applied voltage, the effect is the opposite, i.e. the other side becomes hot and the first cold. This is the so called Peltier effect, which consequently is being utilized in the present invention.

The first heat conducting layer 80 according to an embodiment has anisotropic heat conductivity such that the heat conductivity in the main direction of propagation of the layer 80, i.e. along the layer is considerably higher than the heat conductivity crosswise the layer 80. Hereby heat or cold can be dispersed quickly on a large surface with relatively few thermoelectric elements, wherein temperature gradients and hot spots are reduced. The first heat conducting layer 80 is according to an embodiment comprised of graphite.

The graphite layer 80 has according to a variant a composition such that the heat conductivity along the graphite layer lies in the range of 300-2500 W/mK and the heat conductivity crosswise to the graphite layer is in the range of 1-30 W/mK.

Figure 1C:
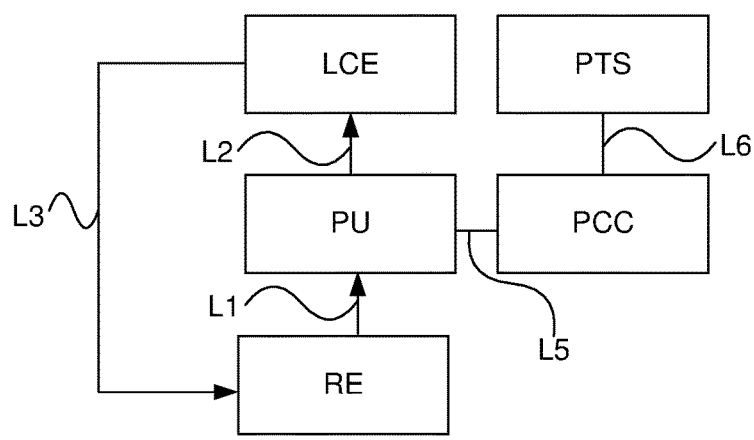
FIG. 1c schematically illustrates a block diagram for part of a device for signature adaptation according to an embodiment of the present invention.

FIG. 1c schematically illustrated a block diagram of a part II of the device for signature adaptation according to an embodiment of the present invention.

Said at least one liquid cooling element LCE is configured for coupling by means of at least one conduit L1, L3 via at least one pump PU to at least one reservoir RE. Said at least one pump is arranged to provide at least on liquid flow from said at least one reservoir to said at least one liquid cooling element. In more detail said at least one pump PU is configured for coupling to a reservoir RE by means of at least one first conduit L1, arranged for transport of said at least one liquid flow from said at least one reservoir to said at least one pump. Said at least one pump is further configured for coupling to said at least one liquid cooling element by means of at least one second conduit L2 arranged for transport of said at least one liquid flow from said at least pump to said at least one liquid cooling element. Said at least one liquid cooling element is further configured for coupling to at least one third conduit L3 for transport of said at least one liquid flow away from said at least one liquid cooling element, such as transport to the surroundings or for transport back to said at least one reservoir.

Said at least one reservoir comprises at least one liquid cooling medium. Said at least one liquid cooling medium may comprise one or more substances of the following group of substances: water, oil, di-electric fluid, polyalphaolefin (PAO), ehtylen glycol or other suitable substance for use as cooling medium. Said at least one cooling medium may also comprise a mix of a plurality of said above mentioned substances. Said at least one cooling medium may also comprise additional additives suitable for providing different types of characteristics to said at least one cooling medium such as corrosion inhibition, anti-freezing, flame retardant etc. Preferably said at least one cooling medium comprises water.

Said at least one pump is further configured for coupling to at least one pump control circuit PCC, arranged for control of said at least one pump to enable control of said at least one liquid flow. Said at least one pump control circuit may for example be comprised of a PID control circuit or other type of suitable control circuit. Said at least one pump control circuit PCC may also be configured for coupling to one or more sensors PTS for temperature and/or flow measurements. Said one or more sensors may be arranged to provide input data to said at least one pump control circuit so as to enable said at least one pump control circuit to calculate control data for control of said at least one pump with the purpose of control said at least one liquid flow based on said input data. For example at least one temperature sensor PTS, may be configured to measure temperature of said at least one liquid cooling element or of said inner surface 150:B of said at least one temperature generating element 150. Said sensor PTS may for example be a temperature sensor 210 such as exemplified with reference to FIG. 10.

According to an embodiment each of said at least one first, second and third conduit, arranged for conduct/transport of liquid flow, be comprised of at least one pipe, at least one hose or other suitable duct for conduct of liquid flow.

According to an embodiment in case the device for signature adaptation is intended for implementation on a marine craft said reservoir is comprised of sea or ocean water. According to this embodiment said at least one pump is arranged to create an in-flow of sea or ocean water by means of a conduit for in-flow placed under the water level of the craft on which said device for signature adaptation is intended to be placed. According to this embodiment an outflow from said at least one liquid cooling element is further arranged to be brought back to the sea or ocean.

Figure 1D:
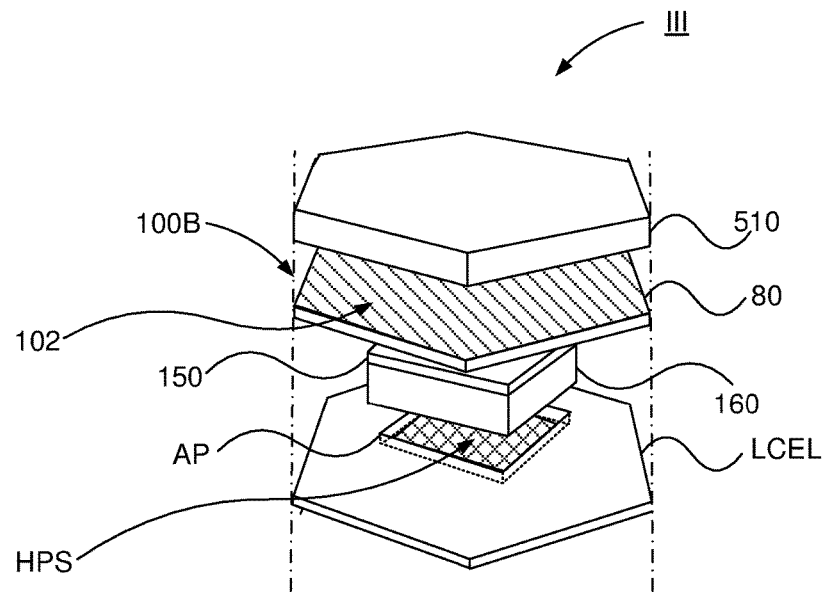
FIG. 1d schematically illustrates an exploded perspective view of different layers of a device according to an embodiment of the present invention.

FIG. 1d schematically illustrates an exploded perspective view of a part III of a device for signature adaptation according to an embodiment of the present invention.

The device comprises a surface element 100B comprising a housing element 510, a first heat conducting layer 80, a liquid cooling element layer LCEL and a heat plate structure HPS, wherein the heat plate structure HPS and the liquid cooling element layer constitutes parts of a liquid cooling element, such as liquid cooling element LCE exemplified with reference to any of FIG. 1a, FIG. 1b and FIG. 1c. The surface element 100B further comprises at least one temperature generating element arranged to generate at least one predetermined temperature gradient. The temperature generating element 150 for example shaped of a thermoelectric element 150 is arranged to generate said predetermined temperature gradient to a portion of said first heat conducting layer 80. The surface element 100B is further arranged to comprise a control circuit, such as a control circuit 200 exemplified with reference to FIG. 6, which is arranged to be electrically/communicatively coupled to the temperature generating element 150, wherein the control circuit 200 is arranged to provide control signals relating to said at least one predetermined temperature gradient.

The liquid cooling element layer LCEL is arranged as an insulating layer. The liquid cooling element layer LCEL further comprises an aperture, arranged to receive the temperature generating element 150 or the temperature generating element and an intermediate heat conducting element 160. The liquid cooling element layer LCEL is arranged to face the first heat conducting layer 80. In more detail the liquid cooling element layer LCEL is arranged inwardly of the first heat conducting layer.

The heat plate structure HPS is arranged to face the liquid cooling element layer. In more detail the heat plate structure HPS is arranged inwardly of the liquid cooling element layer LCEL and overlapping the aperture AP of the liquid cooling element layer LCEL i.e. arranged on a surface of the liquid cooling element layer which is opposite to the surface being arranged to face the first heat conducting layer 80. This enable the heat plate structure HPS to thermally contact the temperature generating element 150. The heat plate structure is arranged to disperse heat energy from the temperature generating element in direction along the propagation of the surface of the heat plate structure HPS.

According to an embodiment the heat plate structure HPS is arranged over a larger surface of the liquid cooling element layer LCEL than the surface that is comprised of the aperture AP. This creates a larger effective surface to which a cooling element, such as a cooling plate LCP exemplified with reference to any of FIG. 1e and FIGS. 3a-3c can be applied in order to achieve cooling of the temperature generating element 150, which is illustrated in more detail in FIG. 1e.

The surface element 100B according to this embodiment comprises a housing element 510. The housing element 510 is arranged as an outer protective housing. The housing element 510 is arranged to be applied by means of a fastener, such as a sealing fastener applied to one or more structures and/or elements of a platform or object that is desired to be hidden by means of the thermal adaptation enabled by the system. The housing element 510 may also be arranged to be applied by means of a fastener, such as a sealing fastener applied to a framework/support element such as a support element exemplified with reference to FIG. 12a, wherein the support element is arranged to be mounted on a platform or an object that is desired to be hidden by means of the thermal adaptation that is enabled by the system. The housing element 510 forms a mainly sealing encasing of the first heat conducting layer 80, the liquid cooling element layer LCEL, the control circuit 200, the intermediate heat conducting layer, the heat plate structure HPS and the temperature generating element 150. The housing element 510 is further arranged to be heat conductive.

According to an embodiment the housing element 510 is comprised of corrosion resistant and heat conductive material, such as for example aluminium.

According to an embodiment of the device according to the invention the housing element 510 of the surface element is arranged to be water proof to facilitate marine application areas wherein the surface elements are mounted on structures located below or above the water line of a marine craft. In more detail the housing element is arranged to encapsulate element/layers of the surface element so that they become protected against exposure from water.

The first heat conducting layer 80 is arranged inwardly of the housing element 510.

The first heat conducting layer 80 has anisotropic heat conductibility such that the heat conductibility in direction along the main propagation of the layer, i.e. along the layer 80 is substantially higher than the heat conductibility crosswise the layer 80. Hereby heat or cold can be dispersed quickly on a large surface with relatively few thermoelectric elements, whereby temperature gradients and "hot-spots" can be reduced. The first heat conducting layer 80 according to an embodiment comprised of graphite.

The temperature generating element 150 is according to an embodiment arranged in the liquid cooling element layer LCEL. In more detail the temperature generating element 150 is arranged embedded in an aperture AP arranged in the liquid cooling element layer LCEL. The temperature generating element 150 is configured in such a way that when a voltage is supplied, i.e. a current is supplied to the temperature generating element 150, heat from one side of the temperature generating element 150 transcends into the other side of the temperature generating element 150. The temperature generating element 150 is hence arranged between two heat conducting layers/structures 80, HPS for example graphite layers, with asymmetric heat conductibility in order to effectively disperse and evenly distribute heat or cold and a heat plate structure HPS, arranged for transport of heat by means of state change of a liquid cooling medium. Due to the combination of the heat conducting layer 80, with anisotropic heat conductibility, the heat plate structure HPS, arranged for transport of heat by means of state change in a liquid cooling medium, the liquid cooling element layer LCEL, with insulating properties and a cooling plate, such as a cooling plate LCP exemplified with reference to FIG. 3a, a surface 102 of the surface element 100B, which according to this embodiment is comprised of the surface of the first heat conducting layer 80, thermally be adapted quickly and effectively by means of supplying of a voltage to the temperature generating element. The temperature generating element 150 is in thermal contact with the first heat conducting layer 80 and the heat plate structure HPS.

According to an embodiment the device comprises an intermediate heat conducting element 160 arranged in the liquid cooling element layer LCEL, inwardly of the temperature generating element 150 in order for filling the space between the thermoelectric element 150 and the heat plate structure HPS. This in order to facilitate more efficient heat conduction between the temperature generating element 150 and the heat plate structure HPS. The intermediate heat conducting element has anisotropic heat conductibility where the heat conduction is considerably better crosswise to the element than along the element, i.e. it is conducting heat considerably better crosswise to the layers of the surface element 100B. This is apparent from FIG. 1e. According to an embodiment the intermediate heat conducting element 160 is constituted by graphite with the corresponding properties as the first heat conducting layer 80 but with anisotropic heat conduction in a direction perpendicular to the heat conduction of the first heat conducting layer 80.

According to an embodiment the intermediate heat conducting element 160 is arranged in an aperture AP arranged to receive said intermediate heat conducting element 160. Said aperture AP is arranged to extend through the liquid cooling element layer LCEL.

The liquid cooling element layer LCEL may further be adapted in size with respect to the temperature generating element 150 or with respect to the temperature generating element 150 and the intermediate heat conducting element 160 such that there is no space between the temperature generating element 150 and the heat plate structure HPS or such that there is no space between the intermediate heat conducting element 160 and the heat plate structure HPS.

According to an embodiment the first heat conducting layer 80 has a thickness in the range of 0.1-2 mm, for example 0.4-0.8 mm, wherein the thickness amongst others depends on application and desired heat conductibility and efficiency.

According to an embodiment the liquid cooling element layer LCEL has a thickness in the range of 1-30 mm, for example 10-20 mm, wherein the thickness amongst others depends on application and desired efficiency.

According to an embodiment the temperature generating element 150 has a thickness in the range of 1-20 mm, for example 2-8 mm, according to a variant about 4 mm, wherein the thickness amongst others depends on application and desired heat conductibility and efficiency. The thermoelectric element has according to an embodiment a surface in the range of 0.01 mm2-200 cm2.

According to an embodiment the temperature generating element 150 has a square or other arbitrary geometric shape, for example hexagonal shape.

The intermediate heat conducting element 160 has en thickness that is adapted so that it fills the space between the temperature generating element 150 and the heat plate structure HPS. According to an embodiment the intermediate heat conducting element has a thickness in the range of 5-30 mm, for example 10-20 mm, according to a variant about 15 mm, wherein the thickness amongst others depends on application and desired heat conductibility and efficiency.

According to an embodiment the housing element 510 has a thickness in the range of 0.2-4 mm, for example 0.5-1 mm and depends amongst others on application and efficiency.

According to an embodiment the surface of the surface element 100B is in the range of 25-8000 cm2, for example 2000-6000 cm2. According to an embodiment the thickness of the surface element is in the range of 5-60 mm, for example 10-20 mm, wherein the thickness amongst others depends on application and desired heat conductibility and efficiency.

Figure 1E:
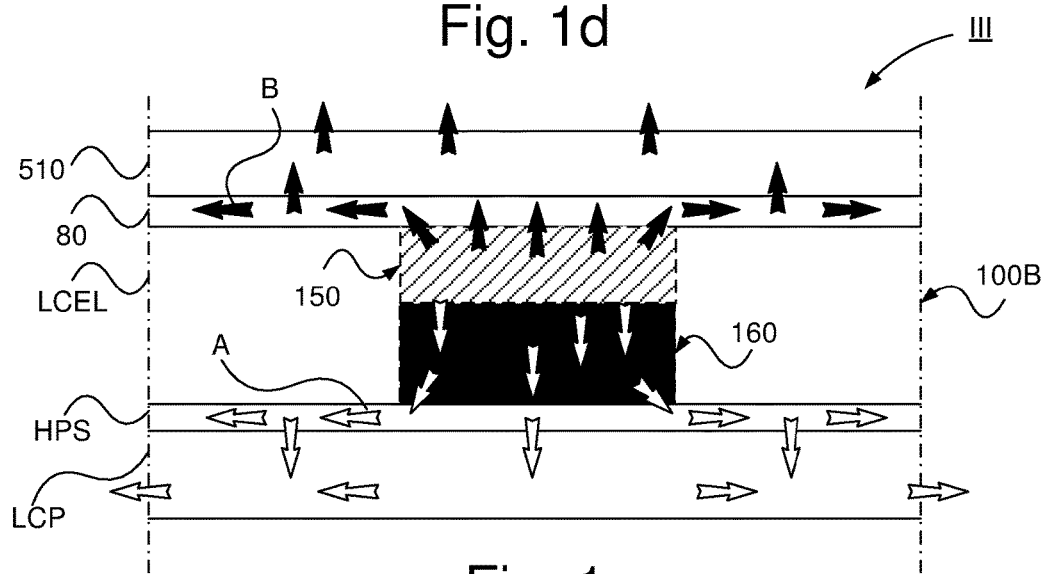
FIG. 1e schematically illustrates flows of the device in FIG. 1c.

FIG. 1e schematically illustrates a side view of flows of the part III of a device for signature adaptation according to an embodiment of the present invention.

The device comprise a surface element 100B arranged to assume a determined thermal distribution, wherein said surface element comprises a housing element 510, a first heat conducting layer 80, an intermediate heat conducting element 160, a heat plate structure, a liquid cooling plate LCP, wherein said first heat conducting layer and said heat plate structure are mutually heat insulated by means of a liquid cooling element layer LCEL with insulating properties, and a temperature generating element 150 arranged to generate a predetermined temperature gradient to a portion of said first heat conducting layer 80.

As apparent from FIG. 1e the heat is transported from one side of the temperature generating element 150 and transcends to the other side of the temperature generating element and further through the intermediate heat conducting layer 160, heat transport being illustrated with white arrows A or non-filled arrows A and transport of cold is illustrated with black arrows B or filled arrows B, transport of cold physically implies diversion of heat having the opposite direction to the direction for transport of cold. Here it is apparent that the first heat conducting layer 80, which according to an embodiment is constituted by graphite, has anisotropic heat conductibility such that the heat conductibility in the main direction of propagation, i.e. along the layer, is considerably higher than the heat conductibility crosswise to the layer. Hereby heat or cold may be dispersed quickly on a large surface with relatively few thermoelectric elements and relatively low supplied power, whereby temperature gradients and hot spots are reduced. Further an even and constant desired temperature may be kept during a longer time.

Heat is further transported through the heat plate structure HPS and the liquid cooling plate LCP, which constitutes a part of a liquid cooling element, such as a liquid cooling element configured for coupling to a pump and a reservoir which is described in FIG. 1c, wherein a liquid flow is created that comprises a cooling medium, wherein the liquid flow passed through the liquid cooling plate LCP for dispersion of heat from the heat plate structure HPS and thereby also away from the temperature generating element.

Heat is further conducted from the first heat conducting layer 80 up into the housing element 510.

Figure 2A:
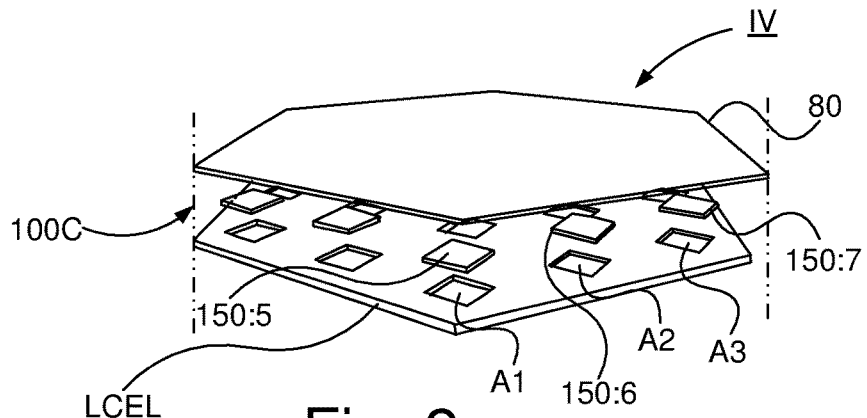
FIG. 2a schematically illustrates an exploded perspective view seen obliquely from above of different layers of part of a device according to an embodiment of the present invention.

FIG. 2a schematically illustrates an exploded perspective view seen obliquely from above of a part IV of a device for signature adaptation according to an embodiment of the present invention.

Figure 2B:
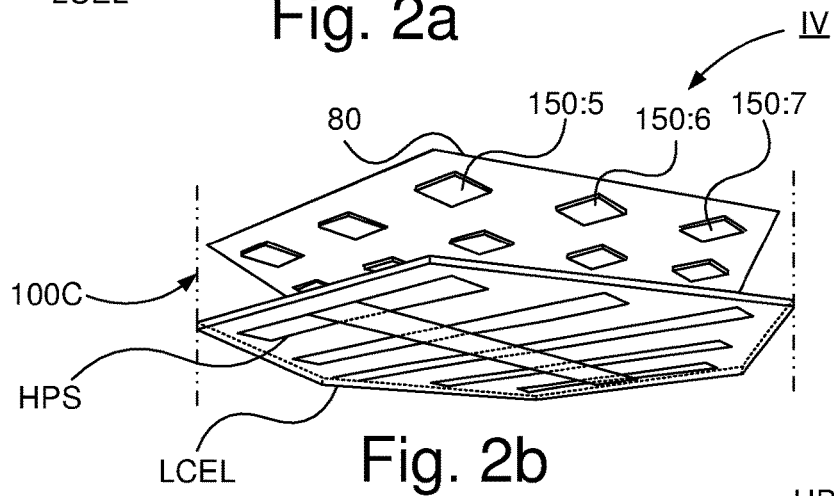
FIG. 2b schematically illustrates an exploded perspective view seen obliquely from below of different layers of part of a device according to an embodiment of the present invention.

FIG. 2b schematically illustrates an exploded perspective view seen obliquely from below of the part IV illustrated in FIG. 2a of a device for signature adaptation according to an embodiment of the present invention.

With reference to FIG. 2a and FIG. 2b said device for signature adaptation according to an embodiment comprises as surface element 100C comprising a plurality of temperature generating elements 150:5, 150:6 and 150:7, each arranged to generate a predetermined temperature gradient to a portion each of the surface element 100C. Preferably said plurality of temperature generating elements are arranged to face to a plurality of portions of the surface of the first heat conducting layer 80 such that these plurality of portions are evenly distributed over the surface of the first heat conducting layer. In more detail said plurality of temperature generating elements 150:5, 150:6 and 150:7 arranged to generate at least one predetermined temperature to a portion each of the surface element 100C, such as to a portion each of the first heat conducting layer 80. By means of that each of said plurality of temperature generating elements 150:5-150:7 jointly contribute to controlling the temperature of the first heat conducting layer 80 it is facilitated to control the temperature quicker and/or to construct the outer layer to be larger as compared to using a single temperature generating element. The surface element 100C further comprises a liquid cooling element layer LCEL, which constitutes a part of a liquid cooling element LCE, such as a part of said liquid cooling element LCE illustrated with reference to any of FIGS. 1*a-c*. The liquid cooling element layer is arranged to face the first heat conducting layer 80. In more detail said liquid cooling element layer comprises a plurality of apertures A1, A2, A3, such as a plurality of apertures fully or partly extending through the liquid cooling element layer LCEL. Said plurality of apertures is adapted with respect to the number of temperature generating elements 150:5-150:7 and arranged to receive said plurality of temperature generating elements. This in order for the liquid cooling element layer to be arranged facing the first heat conducting layer 80 surrounding the plurality of temperature generating elements. The liquid cooling element layer LCEL comprises material with good heat insulation ability for example in the form of die cast plastics such as for example polyurethane. The liquid cooling element layer LCEL comprises at least one heat plate so called "Heat Pipe", which constitute a part of a heat plate structure HPS, such as a heat plate structure exemplified with reference to FIG. 2*d*. Said heat plate structure is arranged to face an underside of the liquid cooling element layer i.e. a side of the liquid cooling element layer opposite of the side of the liquid cooling element layer that is arranged to face the first heat conducting layer 80. In more detail each of said heat plate structures are arranged to face an underside of the liquid cooling element layer LCEL such that at least one portion of at least one of said heat plate structures covers said plurality of apertures arranged in the liquid cooling element layer. This means that each temperature generating element of said plurality of temperature generating element thermally contacts at least one portion of the heat plate structure. Said heat plate structure is arranged for transport of heat from said plurality of temperature generating elements. In more detail said heat plate structure is arranged for transport of heat from a surface of said at least one temperature generating element 150 in the form of an inner surface 150:B exemplified with reference to FIG. 1*b*. The heat plate structure is arranged to transport thermal energy supplied to the heat plate structure along the extension of the surface of the heat plate structure. This takes place by means of that thermal energy (heat, cold) provided to one or more portions of the heat plate structure rapidly is distributed over its entire extension.

According to an embodiment said at least one heat plate of the heat plate structure is configured as a self-contained thermodynamic machine for transport of heat effect by means of state change in a liquid medium. In more detail the heat plate may be constructed around a base in the form of a metal pipe, such as a metal pipe of copper. An inner wall of the metal pipe is clad with a material acting as a wick. The wick is saturated with a liquid, typically water. The pipe is moreover emptied from atmosphere (vacuum pumped) and tightly sealed. When heat is supplied from outside onto an area of the pipe the liquid of the wick at this point starts to vaporise, since the negative pressure in the pipe lowers the boiling point of the liquid. The state change from liquid to gaseous state binds heat energy. The creation of steam creates a local positive pressure by the hot area, and the steam is transported with high velocity to the cold areas of the pipe, where a negative pressure is still prevailing. There the liquid is condensed back into the wick, and gives off the heat it had bound. The liquid is then by means of capillary effects drawn back into the hot area of the wick and the cycle of operation may restart. The effect of this is that the heat plate always strives to become isothermal over its entire length, and that it can transport heat with high efficiency. In more detail the pressure of said at least one heat plate is relatively low, wherefore the specific steam pressure of the liquid makes the liquid in the wick to vaporizing in the point where heat is applied. The steam in this position has a considerably higher pressure than its surrounding which results in it dispersing quickly to all areas with lower pressure, in which areas it condenses into the wick and emits its energy in the form of heat. This process is continuous until an equilibrium pressure has arisen. This process is at the same time reversible such that even cold, i.e. lack of heat can be transported with the same principle. The heat plate is also completely self-contained, i.e. it has no gaskets, fasteners, couplings or similar that may leak and does furthermore not require an external power source, apart from the actual heat which the heat plate is intended to transport.

Said at least one heat plate comprises according to variant sealed aluminium or copper with internal capillary surfaces in the shape of wicks, the wicks according to a variant being constituted by sintered copper powder. The wick is according to a variant saturated with liquid which under different processes either is vaporized or condensed. Type of liquid and wick is determined by the intended temperature range and determines the heat conductibility.

The advantage of using a heat plate is that it has very efficient heat conductibility, substantially higher than e.g. conventional copper. The ability to transport heat, so called Axial Power Rating (APC), is impaired with the length of the pipe and increases with its diameter. The heat plate facilitate quick dispersal of excessive heat from the underside of the temperature generating elements to underlying layers, such as to a liquid cooling plate exemplified with reference to FIG. 3*a*, due to their good ability to distribute heat on large surfaces. By means of heat plate quick diversion of excessive heat which e.g. is required during certain sunny situations is facilitated. Due to the quick diversion of excessive heat efficient work of the temperature generating elements 150:5-150:7, is facilitated, which facilitates efficient thermal adaptation of the surrounding continuously.

Figure 2C:
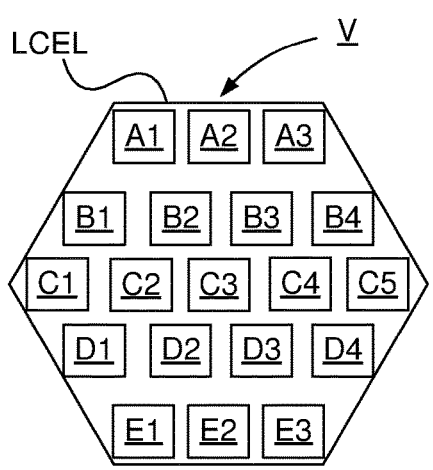
FIG. 2c schematically illustrates a plan view of different layers of part of a device according to an embodiment of the present invention.

FIG. 2*c* schematically illustrated a plan view of a part V of a device for signature adaptation according to an embodiment of the present invention.

According to an embodiment said device for signature adaptation comprises a liquid cooling element layer LCEL, such as a liquid cooling element layer LCEL according to any of FIGS. 2*a* and/or 2*b*, comprising a plurality of apertures A1-A3, B1-B4, C1-C5, D1-D4, E1-E3 each arranged to receive a temperature generating element of a plurality of temperature generating elements, such as a plurality of temperature generating elements exemplified with reference to FIG. 2*a* and/or FIG. 2*b*. According to this embodiment the plurality of apertures are arranged in a geometric pattern in the form of a number of columns. Preferably said apertures are mainly evenly distributed over the surface of the liquid cooling element layer LCEL.

In the illustrated example with reference to FIG. 2c the liquid cooling element layer LCEL comprises a plurality of apertures arranged in a plurality of columns. In more detail the liquid cooling element layer LCEL comprises a first column comprising three apertures A1, A2, A3, a second column comprising four columns B1, B2, B3, B4, a third column comprising five apertures C1, C2, C3, C4, C5, a fifth column comprising four apertures D1, D2, D3, D4 and a sixth column comprising three apertures E1, E2, E3.

Figure 2D:
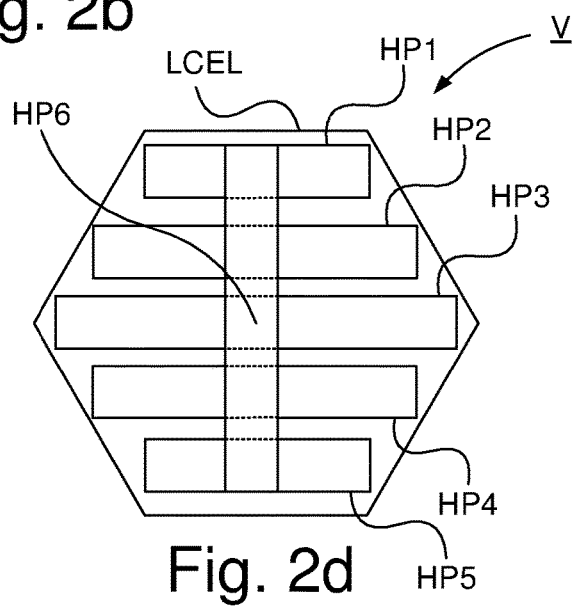
FIG. 2d schematically illustrates a plan view of different layers of part of a device according to an embodiment of the present invention.

FIG. 2d schematically illustrated a plan view seen from below of the part V, illustrated in FIG. 2c, of a device for signature adaptation according to an embodiment of the present invention.

According to an embodiment with reference to FIG. 2d a plurality of heat plates HP1-HP6 comprised in the heat plate structure HPS, exemplified with reference to FIG. 2b, are arranged to face the liquid cooling element layer LCEL such that these overlap the apertures exemplified with reference to FIG. 2c. In more detail said heat plates are arranged to face an underside of the liquid cooling element layer LCEL, i.e. face a side opposite of the side of the liquid cooling element layer LCEL that is arranged to face the first heat conducting layer 80, exemplified with reference to FIG. 2a. Since the apertures each are arranged to receive a respective temperature generating element and since the heat plates are arranged to face an underside of the liquid cooling element layer LCEL it is facilitated that the heat plates thermally contacts each other, such as physically contacts, an underside 150:B of at least one temperature generating element of said plurality of temperature generating elements.

According to an embodiment a first set of heat plates, in the form of the heat plates HP1-HP5, is arranged to be applied such that each heat plate of said first set of heat plates is arranged along with and overlapping a column of apertures of said plurality of columns of apertures of the liquid cooling element layer LCEL, such as said first, second, third, fourth and fifth column exemplified with reference to FIG. 2c. Preferably each heat plate of the first set of heat plates is arranged to overlap the entire surface of a respective aperture.

According to an embodiment a transversal heat plate HP6 is arranged to face the liquid cooling element LCEL such that this transversal heat plate contacts a central portion of each heat plate of said first set of heat plates HP1-HP5.

In more detail said transversal heat plate HP6 is arranged perpendicular to said first set of heat plates HP1-HP5. By means of the transversal heat plate being arranged perpendicular it is enabled that the transversal heat plate contacts a portion of each heat plate of the first set of heat plates. This means that heat from each heat plate of the first set of heat plates is transported to the transversal heat plate. This also means that by applying cold to the transversal heat plate cold is also applied to each heat plate of the first set of heat plates. This facilitates using a structure of a cooler, such as a liquid cooling plate exemplified with reference to FIG. 3a, that necessarily not bed to cover the entire surface of the plurality of temperature generating element and/or the total surface of the heat plates.

It should be noted that the number of temperature generating elements and the distribution of the portions of the first heat conducting layers that these number of temperature generating elements thermally contacts and associated configuration of the apertures (pattern) and the heat plates may be configured differently than the configuration exemplified in FIG. 2a, FIG. 2b, FIG. 2c and FIG. 2d. For example more or fewer temperature generating element may be comprised in the configuration. Furthermore the pattern according to which the apertures of the liquid cooling element layer is arranged may be configured differently such as for example by means of that more of fewer apertures may be comprised in the pattern. Furthermore the number of heat plates and their placement may be configured differently. Each of the plurality of temperature generating elements 150:5-150:7 may also be arranged to face a plurality of intermediate heat conducting layers, such a plurality of intermediate heat conducting layers configured such as the intermediate heat conducting layer 160 exemplified with reference to FIG. 1d.

Figure 3A:
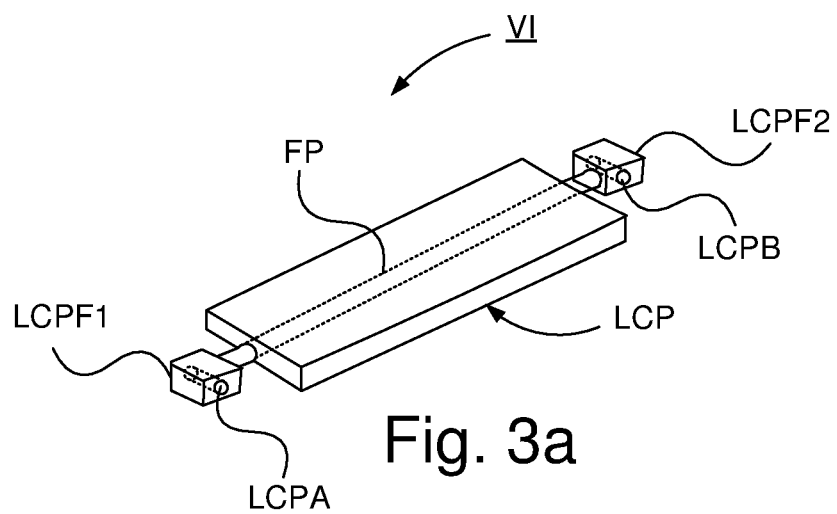
FIG. 3a schematically illustrates a perspective view of part of a device according to an embodiment of the present invention.

FIG. 3a schematically illustrates a perspective view of a part VI of a device for signature adaptation according to an embodiment of the present invention.

With reference to FIG. 3a a liquid cooling plate LCP is shown which is arranged to be thermally applied to a heat plate, such as at least one heat plate of said plurality of heat plates exemplified with reference to any of FIG. 2b or FIG. 2d.

The liquid cooling plate LCP is arranged to transport thermal energy, such as heat energy that occurs on an inner surface 150:B of a temperature generating element, such as of said at least one temperature generating element 150, exemplified with reference to any of FIG. 1a or FIG. 1b, when this element generates a predetermined temperature gradient. In more detail the liquid cooling plate LCP constitutes a part of the liquid cooling element layer LCEL, which in turn constitutes a part of a liquid cooling element LCE, such a part of said liquid cooling element LCE illustrated with reference to any of FIGS. 1a-c. The liquid cooling plate is arranged to thermally contact, such as physically contact a portion of a heat plate, such as at least one heat plate of said plurality of heat plated of the liquid cooling element layer LCEL exemplified with reference to any of FIG. 2b or FIG. 2d. Preferably the liquid cooling plate is arranged to physically contact a portion of a heat plate. The liquid cooling plate LCP comprises a flow path FP integrally shaped of the liquid cooling plate, such as integrally shaped in a housing of the liquid cooling plate. The liquid cooling plate further comprises an inlet (not shown) to the flow path for inflow of a liquid flow, such as at least one liquid flow exemplified with reference to FIG. 1c. The liquid cooling plate further comprises an outlet from the flow path (not shown) for outflow of a liquid flow, such as at least one liquid flow exemplified with reference to the description of FIG. 1c.

The liquid cooling plate comprises a first flow passage element LCPF1 arranged in the liquid cooling plate and which is configured for coupling to the inlet of the flow path and to at least one conduit for inflow of a liquid flow, such as said second conduit L2 exemplified with reference to FIG. 1c. The liquid cooling plate further comprises a second flow passage element LCPF2 arranged in the liquid cooling plate and which is configured for coupling to the outlet of the flow path and a conduit for outflow of a liquid flow, such as said third conduit exemplified with reference to FIG. 1c.

The function of the liquid cooling plate comprises, by means of providing a liquid flow, comprising a cooling medium, in a flow path extending through the liquid cooling plate so that the housing of the liquid cooling plate is cooled whereby one or more components/parts, such as a heat plate, thermally applied to the liquid cooling plate is cooled.

According to an embodiment the housing of said liquid cooling plate is comprised of a heat conductive material such as for example a metallic heat conductive material in the form of aluminium.

According to an embodiment said at least one flow path is integrally shaped in said liquid cooling plate is comprised of stainless steel, such as acid resistant stainless steel. Said acid resistant stainless steel may for example be comprised of high-alloy austenitic stainless steel.

According to an embodiment said liquid cooling plate is configured to enable coupling of a plurality of liquid cooling plates in parallel. According to this embodiment the first and second flow passage element each comprises an aperture LCPA, LCPB extending through said flow passage element. Said apertures LCPA, LCPB are area coupled to a respective inlet and outlet of the flow path of the liquid cooling plate in order to facilitate transport of a liquid flow from and to the flow path as well as through the flow passage elements. This enables that a plurality of liquid cooling elements may be coupled in parallel. This may be achieved by means of coupling at least one conduit, such as said second conduit L2 exemplified with reference to FIG. 1c, to attachment means (screw, press joint or other suitable fastener) of the respective first flow passage element of each the plurality of liquid cooling element such that the liquid flow passing through the second conduit passes through the first flow passage element of each of the plurality of liquid cooling elements and is canalised into the flow path of each of the plurality of liquid cooling elements. In a similar fashion at least one conduit, such as a third conduit L3, exemplified with reference to FIG. 1c, may be coupled to the second flow passage element of each of the plurality of liquid cooling elements such that the liquid flow passing through the third conduit passes through the second flow passage element of each of the plurality of liquid cooling elements and such that the liquid flow passing through the flow path of each of the plurality of liquid cooling element is canalised out from the liquid cooling elements to the third conduit.

Figure 3B:
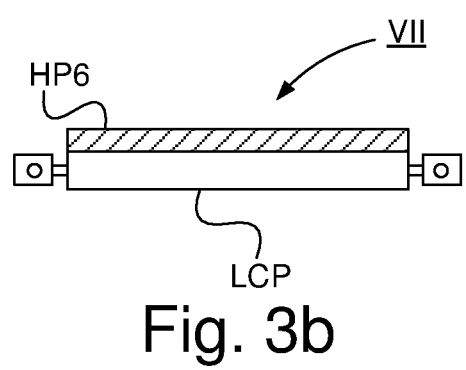
FIG. 3b schematically illustrates a side view of part of a device according to an embodiment of the present invention.

FIG. 3b schematically illustrates a side view of the part VII of the device for signature adaptation according to an embodiment of the present invention.

With reference to FIG. 3b a liquid cooling plate LCP is shown, such as a liquid cooling plate with reference to FIG. 3a, thermally contacting a heat plate HP6, such as at least one heat plate of said plurality of heat plates exemplified with reference to any of FIG. 2b or 2d.

According to an embodiment the liquid cooling plate is arranged to thermally contact at least one heat plate of said plurality of heat plates exemplified with reference to any of FIG. 2b or 2d, such as a centrally placed heat plate HP6 thermally contacting a plurality of heat plates of the first set of heat plates HP1-HP5.

It should be noted that said liquid cooling plate LCP may be configured differently than as described with reference to FIGS. 3a and 3b. For example the liquid cooling plate may comprise a plurality of flow paths. The liquid cooling plate may also be constructed by other materials suitable for its purpose. The liquid cooling plate may also comprise a plurality of inlets/outlets. Further a plurality of liquid cooling plates may be arranged to thermally contact a plurality of heat plates, exemplified with reference to any of FIG. 2b or 2d.

Figure 4:
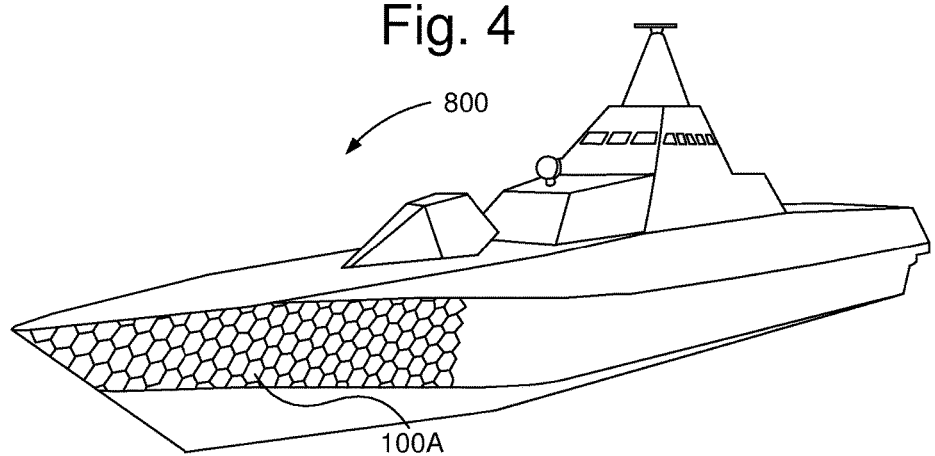
FIG. 4 schematically illustrates the device for signature adaptation arranged on an object such as a craft, according to an embodiment of the present invention.

FIG. 4 schematically illustrates a perspective view of a plurality of surface elements arranged on a platform according to an embodiment of the present invention.

With reference to FIG. 4 a platform 800 is shown, provided with a plurality of said surface elements 100A, for example according to FIG. 1a, arranged exteriorly on a portion of the platform 800. Said surface elements may be arranged, in a plurality of configuration that differs from the configuration of the surface elements exemplified in FIG. 3. For example more or fewer surface element may be comprised in the configuration and these surface elements may be arranged on more portions and/or larger portions of parts of the platform. The exemplified platform 800 is a military marine craft, such as a surface combat ship. According to this example the platform 800 is a destroyer or a corvette. According to a preferred embodiment the craft 800 is a military craft. The platform 800 may also be a marine craft, such as an aircraft carrier, a mine laying craft, mine removal craft, a destroyer, rocket bearing craft, a patrol craft, a U-boat, a frigate, a battle ship, a landing craft, a surveillance craft.

According to an alternative embodiment the platform 800 is a stationary military unit. Herein the platform 800 is described as a craft or a marine craft, but it should be noted that the invention also is realizable and implementable in a ground craft, such as a tank. According to an embodiment the platform is an aerial craft such as for example a helicopter. According to an alternative embodiment the platform is a civilian craft according to any of the above mentioned types.

It should be appreciated that the surface element 100A by which said platform 800 is provided with a number may be configured in a number of different ways. For example each surface element 100A of said plurality of surface elements may be configured in accordance to any of the surface elements 100A-100F such as exemplified with reference to any of FIGS. 1a-b, 1d-e, 2a-b, 5a-b or 8a-b.

Figure 5A:
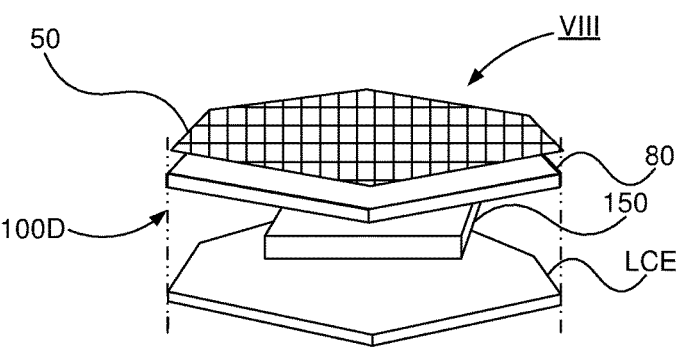
FIG. 5a schematically illustrates an exploded perspective view of different layers of part of a device for thermal adaptation according to an embodiment of the present invention.

FIG. 5a schematically illustrates an exploded perspective view of the part VII of the device for signature adaptation according to an embodiment of the present invention.

Figure 5B:
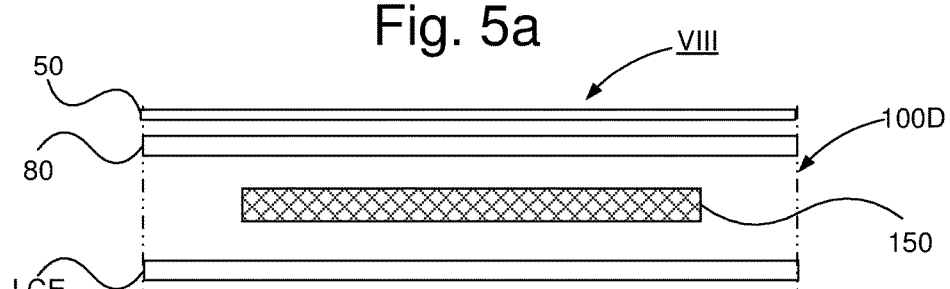
FIG. 5b schematically illustrates an exploded side view of different layers of part of a device for thermal adaptation according to an embodiment of the present invention.

FIG. 5b schematically illustrates an exploded side view of the part VIII of the device for signature adaptation in FIG. 5a.

The device according to this embodiment comprises a surface element 100D. The configuration of the surface element 100D with reference to FIGS. 5a and 5b differs from the configuration of the surface element 100A with reference to FIGS. 5a and 5b in that it comprises a display surface 50.

The display surface is arranged to radiate at least one predetermined spectrum. The display surface 50 is arranged on said surface element such that said at least one predetermined spectrum is radiated in a direction towards a viewer. The display surface 50 is arranged to be thermally permeable i.e. arranged to pass through said predetermined temperature gradient from said temperature generating element 150 without substantially affecting said predetermined temperature gradient.

By providing a display surface 50 having a thermal permeability that has an operating range, within which said predetermined temperature gradient falls it is achieved a decoupled solution that permit to individually adapt thermal and visual signature independently of each other.

Figure 6:
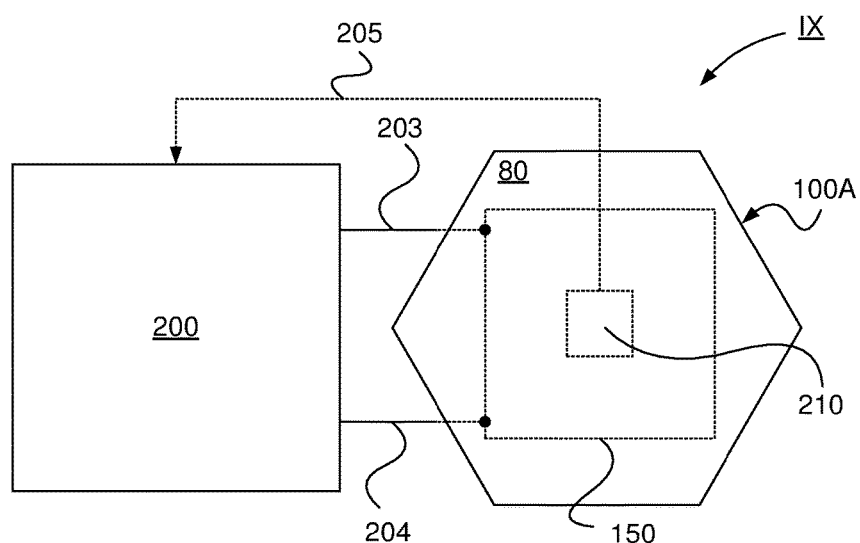
FIG. 6 schematically illustrates a device for signature adaptation according to an embodiment of the present invention.

FIG. 6 schematically illustrates a device IX for signature adaptation according to an embodiment of the present invention.

The device comprises a control circuit 200 or control unit 200 arranged in the surface element 100A, such as for example a surface element 100A according to FIGS. 1a-1b, whereby the control circuit 200 is coupled to the surface element 100A. The surface element 100A comprises at least one temperature generating element 150, such as for example a temperature generating element. Said temperature generating element 150 is arranged to receive current/voltage from the control circuit 200, wherein the temperature generating element 150 in accordance with the above is configured in such a way that when a voltage applied, heat from one side of the temperature generating element 150 transcend to the other side of the temperature generating element 150.

The control circuit is coupled to the temperature generating element via links 203, 204 for voltage supply to the temperature generating element 150.

According to an embodiment for the case when the surface element comprises at least one display surface said display surface is arranged to receive a current/voltage from the control circuit 200, wherein the display surface in accordance with the above is configured in such a way that when a voltage is applied at least one spectrum is radiated from one side of the display surface. According to this embodiment the control circuit 200 is coupled to the display surface via links for electrical connection.

According to an embodiment in case the surface element 100A comprises a plurality of temperature generating elements, such as a surface element 100C, comprising a plurality of temperature generating elements 150:5-150:7, exemplified with reference to any of FIG. 2a or 2b, each of said plurality of temperature generating elements 150:5-150:7 are arranged to receive a voltage/current from the control circuit 200, wherein each of said plurality of temperature generating elements in accordance with the above are configured in such a way that when a voltage is applied, heat from one side of a respective temperature generating element 150:5-150:7 transcends to the other side of the respective temperature generating element 150:5-150:7.

According to an embodiment in case the surface element 100A comprises a plurality of temperature generating elements 150:5-150:7 the control circuit may be arranged to control the supply of current/voltage individually for each of the temperature generating elements.

According to an embodiment in case the surface element 100A comprises a plurality of temperature generating elements, such as a plurality of temperature generating elements 150:5-150:7 exemplified with reference to any of figs. FIG. 2a or 2b, the surface element comprises a plurality of control circuits, each arranged to control supply of voltage/current to a temperature generating element of said plurality of temperature generating elements.

The device according to an embodiment comprises at least one temperature sensing means 210, illustrated with dashed line in FIG. 6, being arranged to sense the current physical temperature of the surface element 100A. The temperature is according to a variant arranged to be compared with temperature information, preferably continuous information, from a thermal sensing means of the control circuit 200. Hereby the temperature sensing means is coupled to the control circuit 200 via a link 205. The control circuit is arranged to receive a signal via the link representing temperature data, whereby the control circuit is arranged to compare temperature data with temperature data from the thermal sensing means.

Said at least one temperature sensing means 210 is according to an embodiment arranged on or in close proximity to the outer surface of the temperature generating element 150 so that the sensed temperature corresponds to the outer temperature of the surface element 100A.

Said at least one temperature sensing means 210 is according to an embodiment arranged on or in close proximity to the inner and/or outer surface of the surface element 100 so that the sensed temperature corresponds to the outer temperature of the surface element 100.

When the sensed temperature using the temperature sensing means 210 in comparison to temperature information from the thermal sensing means of the control circuit 200 deviates, the voltage provided to the temperature generating element 150 is according to an embodiment arranged to be controlled such that actual- and reference values match, whereby the surface temperature of the surface element 100A by means of the temperature generating element 150 is adapted accordingly.

Figure 10:
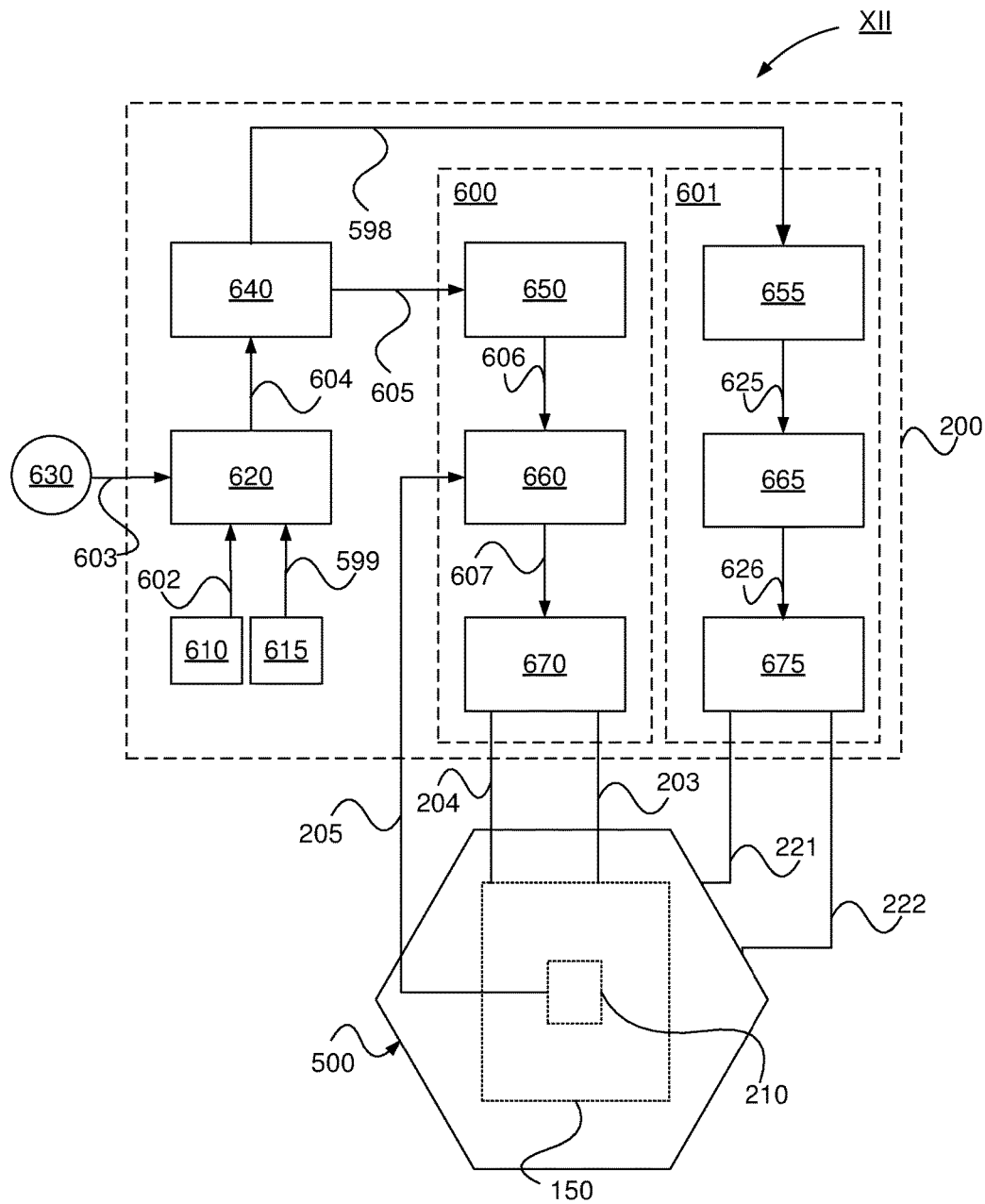
FIG. 10 schematically illustrates a device for signature adaptation according to an embodiment of the present invention.

The design of the control circuit 200 depends on application. According to a variant the control circuit 200 comprises a switch, wherein in such a case voltage over the temperature generating element 150 is arranged to be switched on or off for providing of cooling (or heating) of the surface of the surface element. FIG. 10 shows the control circuit according to an embodiment of the invention, the device according to the invention being intended to be used for signature adaptation relating to thermal, radar and visual camouflage of e.g. a vehicle.

It should be appreciated that the surface element 100A may be configured differently as compared to what is illustrated with reference to FIG. 6. For example the surface element 100A may comprise more or fewer components and/or be configured in accordance to the configuration of any of the surface element 100A-100F such as exemplified with reference to any of FIGS. 1a-b, 1d-e, 2a-b, 5a-b or 8a-b.

Figures 7A, 7B:
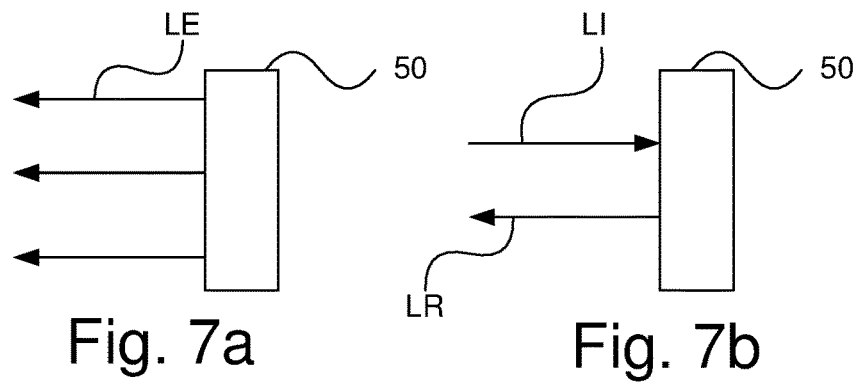
FIG. 7a schematically illustrates a side view of a type of display layer of part of a device according to an embodiment of the present invention.
FIG. 7b schematically illustrates a side view of a type of display layer of part of a device according to an embodiment of the present invention.

FIG. 7a schematically illustrates a side view of a display surface according to an embodiment of the present invention.

According to an embodiment the display surface 50, exemplified with reference to any of FIG. 5a or 5b is of emitting type. By display surface of emitting type is intended a display surface that actively generates and radiates light LE. Examples of display elements of emitting type is for example a display surface that uses any of the following techniques: LCD ("Liquid Crystal Display"), LED ("Light Emitting Diode"), OLED ("Organic Light emitting Diode") or other suitable emitting technology that is based on both organic or non-organic electro-chrome technology or technology similar thereto.

FIG. 7b schematically illustrates a side view of a display surface according to an embodiment of the present invention.

According to a preferred embodiment the display surface 50, such as the display surface exemplified with reference to any of FIG. 5a or 5b is of reflecting type. By display surface of reflecting type is intended a display surface arranged to receive incident light LI and radiate reflected light LR by means of using said incident light LI. Examples of display elements of emitting type is for example a display surface that uses any of the following techniques: ECI ("Electrically Controllable Organic Electro chromes"), ECO ("Electrically Controllable Inorganic Electro chromes"), or other suitable reflecting technology such as "E-ink", electrophoretic, cholesteric, MEMS (Micro Electro-Mechanical System) coupled to one or more optical films, or electro fluidic. By utilizing a display surface 50 of reflecting type it is enabled to produce at least one spectrum that realistically reflects structures/colours since this type uses naturally incident light instead of self-producing light such as for example display surfaces of emitting type such an LCD do. Common for a display surface of a reflecting type is that an applied voltage enables modification of reflection properties for each individual picture element P1-P4. By controlling the applied voltage for each picture element each picture element is thereby enabled to reproduce a certain colour upon reflection of incident light that is dependent on the applied voltage.

According to an alternative embodiment the display surface 50 is of reflecting and emitting type such as multimodal liquid crystal (Multimode LCD). Where said display surface 50 according to this embodiment is arranged to both emit and reflect at least one spectrum.

Figure 7C:
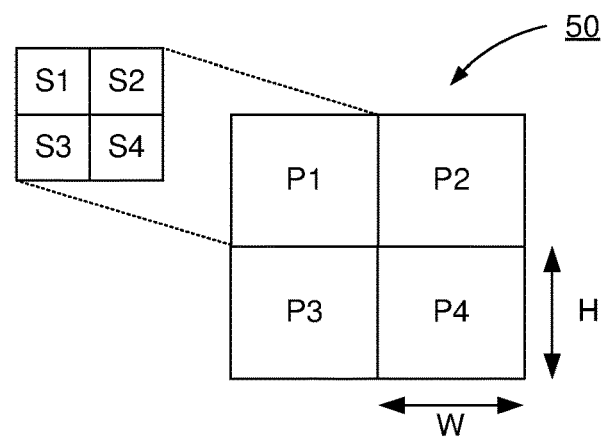
FIG. 7c schematically illustrates a plan view of a display layer of part of a device according to an embodiment of the present invention.

FIG. 7c schematically illustrates a top view of the display surface according to an embodiment of the present invention.

The display surface 50, such as the display surface 50 exemplified with reference to any of FIG. 5a or 5b, comprises a plurality of picture elements ("pixels") P1-P4, wherein said picture elements P1-P4 each comprises a plurality of sub elements ("sub-pixels") S1-S4. Said picture elements P1-P4 have an extension in height H and an extension in width W.

According to an embodiment the picture elements each have an extension in height H in the range of 0.01-100 mm, e.g. 5-30 mm.

According to an embodiment the picture elements each have an extension in width W in the range of 0.01-100 mm, e.g. 5-30 mm.

According to an embodiment each picture element P1-P4 comprises at least three sub elements S1-S4. Where each of said at least three sub elements is arranged to radiate one of the primary colours red, green or blue (RGB) or the secondary colours cyan, magenta, yellow or black (CMYK). By controlling the light intensity that is radiated from the respective sub element using control signals each picture element may radiate any colour/spectrum such as for example black or white.

According to an embodiment each picture element P1-P4 comprises at least four sub elements S1-S4. Where each of said four sub elements is arranged to radiate one of the primary colours red, green or blue (RGB) or the secondary colours cyan, magenta, yellow or black (CMYK) and wherein one of said four sub elements is arranged to radiate one or more spectrums that comprises components falling outside of the visual wave lengths such as for example arranged to radiate one or more spectrums that comprises components within the infrared wave lengths. By radiating one or more spectrum comprising components falling within the infrared area and one or more components falling within the visual area it is enabled to apart from controlling the visual signature to also control the thermal signature using the components falling within the infrared area. This facilitates shortening the response time associated to adapting the thermal signature using said thermoelectric element 150.

Said display surface may be arranged according to several different configurations differing as compared to the exemplified display surface with reference to FIG. 7c. As an example more or fewer picture elements may be part of the configurations and these picture elements may comprise more or fewer sub elements.

The display surface 50 is according to one embodiment constituted by thin film, such as for example thin film substantially constituted by polymer material. Said thin film may comprise one or more active and/or passive layers/thin layers and one or more components such as electrically responsive components/layers or passive/active filters.

The display surface 50 is according to one embodiment constituted by flexible thin film.

The display surface 50 according to an embodiment has a thickness in the range of 0.01-5 mm, e.g. 0.1-0.5 mm and depends among others on application and desired efficiency.

According to an embodiment the picture elements P1-P4 of the display surface 50 has a width in the range of 1-5 mm, e.g. 0.5-1.5 mm and a height in the range of 1-5 mm, e.g. 0.5-1.5 mm, wherein the dimensioning among others depending on application and desired efficiency.

According to an embodiment the display surface has a thickness in the range of 0.05-15 mm, e.g. 0.1-0.5 mm, according to a variant about 0.3 mm, wherein the thickness among others depending on application and thermal permeability, colour reproduction and efficiency.

According to an embodiment the display surface 50 is configured to have an operating temperature range that comprises the temperature range in which thermal adaptation is desired to be performed, such as for example within −20-150° C. This facilitates that reproduction of at least one predetermined spectrum for desired visual adaptation is substantially un-affected by desired temperature for thermal adaptation from underlying layers.

According to an embodiment the display surface 50 is of emitting type and arranged to provide directionally dependent reflection. As an example each picture element of the display surface 50 may be arranged to alternately provide at least two different spectrums. This may be accomplished by providing at least two of each other independent control signals such that each picture element reproduces at least two different spectrums at least two different points in time, defined by one or more update frequencies.

Figure 7D:
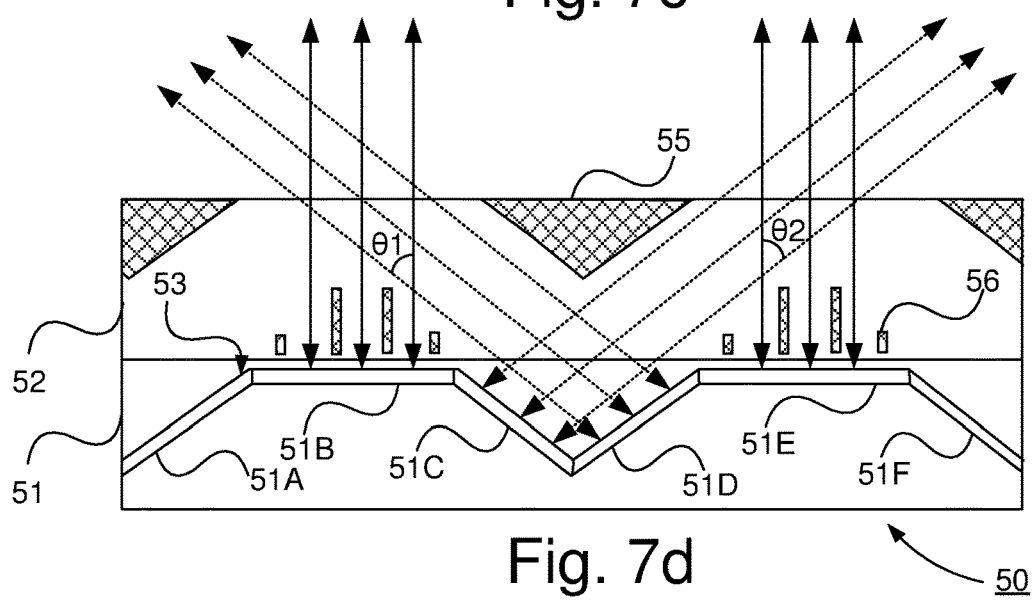
FIG. 7d schematically illustrates a side view of a display layer according to an embodiment of the present invention.

FIG. 7d schematically illustrates a side view of a display surface according to an embodiment of the present invention.

According to an embodiment the display surface 50 is of reflecting type and arranged to provide directionally dependent reflection. According to this embodiment the display surface comprises at least one first underlying display layer 51 and a second upper display layer 52. Said first display layer 51 is arranged as a reflective layer comprising at least one curved reflective surface 53. According to this embodiment the profile of said at least one curved reflective surface is formed as a number of trapezoids. Said second display layer is arranged as an obstructing layer comprising at least one optical filter structure, 55, 56, wherein said at least one filter structure is arranged to obstruct incident light of selected angles of incidence and thereby obstruct reflection from the first display layer 51. Said curved reflective surface 53 comprises a plurality of sub surfaces 51A-F, each arranged to reflect incident light within a predetermined angular range or in a predetermined angle. According to this embodiment the curved reflective surface 53 comprises a first sub surface 51B and a second sub surface 51E arranged substantially parallel to the plane constituted by the display surface. Said first and second subsurface are arranged to reflect light, substantially incident orthogonally to the display surface 50. The curved reflective surface 53 further comprises a third sub surface 51A, a fourth sub surface 51C, a fifth sub surface 51D and a sixth sub surface 51F. Said fourth and sixth sub surfaces 51C, 51F are arranged to reflect light, incident within a predetermined angular range, that is displaced in a first predetermined angle θ1, relative the orthogonal axis. Said third and fifth sub surfaces 51A, 51D are arranged to reflect light, incident within a predetermined angular range, that is displaced in a second predetermined angle θ2, relative the orthogonal axis, wherein said first predetermined angle falls on an opposite side of the orthogonal axis relative said second predetermined angle.

According to an embodiment the obstructing layer comprises at least one first filter structure 55. Where said at least one first filter structure 55 is arranged as a triangle having an extension along a vertical direction of the display surface i.e. shaped as a triangular prism.

According to an embodiment the obstructing layer comprises at least one second filter structure 56, wherein said at least one second filter structure 56 is arranged as a plurality of taps/rods having an extension along an orthogonal direction of the display surface, wherein the length of said at least one second filter structure 56 is configured so as to avoid obstructing light, incident within said predetermined angular range, that is displaced in a first predetermined angle relative the orthogonal axis and light, incident within said predetermined angular range, that is displaced in a second predetermined angle relative the orthogonal axis. This facilitates limiting the angular range within which reflection of light, incident substantially orthogonal towards the display surface takes place.

Figure 7E:
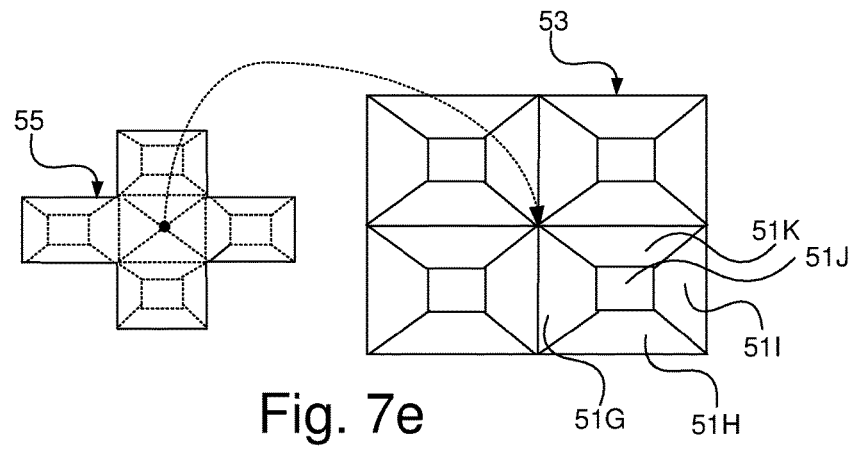
FIG. 7e schematically illustrates a plan view parts of a display layer according to an embodiment of the present invention.

FIG. 7e schematically illustrates a plan view of parts of the display surface according to an embodiment of the present invention.

According to an embodiment said curved reflective surface 53 is arranged to form a three dimensional pattern, wherein said three dimension pattern comprises a number of columns and a number of rows of truncated pyramids, i.e. a matrix of pyramids where an upper structure of the pyramids have been cut in a plane, parallel to the bottom surface of the pyramid. According to this embodiment said at least one first filter structure 55 of the obstructing layer 52 is formed as a central pyramid surrounded by truncated pyramids, whose tapered direction of extensions are opposite to the truncated pyramids of the reflecting layer. A centre point of the obstructing layer that is defined by the position of the top of the centrally positioned pyramid with associated truncated pyramids arranged along the sides of the centrally positioned is arranged to be centered above the intersection point that is formed between the rows and the columns of truncated pyramids of the reflection layer 53, such as illustrated by the dashed arrow in FIG. 7e. By means of arranging the curved reflecting surface 53 and the filter structures 55 as described above, slits orthogonal to the respective subsurface of said reflecting surface are formed that are free of obstruction, whereby directionally dependent reflection is enabled, where reflection of the incident light that falls within said slits is enabled. According to this embodiment each subsurface 51G-51K formed by the front surfaces of the truncated pyramids of the curved reflecting layer is arranged to provide at least one picture element each. This facilitates individually adapted reflection of incident light, falling within five different angles of incidence or five different ranges of angles of incidence.

By providing a directionally dependent display surface 50 according to FIG. 7d-e is facilitated to reproduce at least one spectrum such as one or more patterns and colours in different viewing angles relative an orthogonal axis of the display surface. Hereby is also facilitated to radiate different patterns and colours for different viewing angles.

The configuration of the display surface 50 may differ from the configuration described with reference to FIG. 7d-e. Placement and configuration of filter structures of said obstructing layer may as an example be configured differently. Also the number of filter structures may differ. Said first display layer 51 may be arranged as an emitting layer. The display surface 50 may comprise more or fewer layers. Further interference phenomena's together with one of more reflection layers, optical retardation layers and one or more circular polarized or one or more linearly polarized layers in combination with one or more quarter wave retardation layers may be utilized to provide directionally dependent reflection.

According to an embodiment the display surface 50 comprise at least one barrier layer, wherein said at least one barrier layer is arranged to have thermal and visual permeability and substantially impermeable to moisture and liquid. By applying the at least one barrier layer to the display surface robustness and endurance are improved in terms of external environmental influence.

Figure 8A:
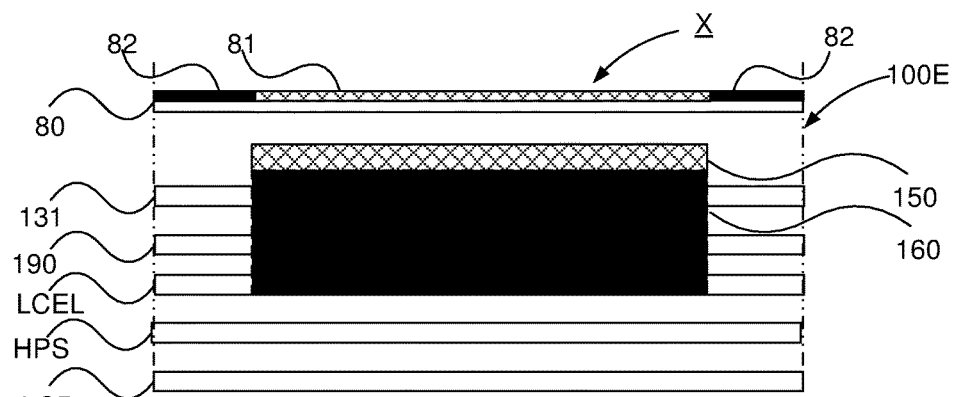
FIG. 8a schematically illustrates an exploded side view of different layers of part of a device according to an embodiment of the present invention.

FIG. 8a schematically illustrates an exploded side view of a part X of the device for signature adaptation according to an embodiment of the present invention.

With reference to FIG. 8a a surface element 100E is shown. The surface element 100E comprises a temperature generating element 150 arranged to generate at least one predetermined temperature gradient. Said at least one temperature generating element 150 is arranged to generate said at least one predetermined temperature gradient to a portion of a first heat conducting layer 80 of said surface element 100E. The surface element 100E further comprises an intermediate heat conducting element 160, such as an intermediate heat conducting element exemplified with reference to FIG. 1d. The surface element 100E further comprises a liquid cooling element LCE, such as a liquid cooling element comprising a liquid cooling element layer LCEL, a heat plate structure HPS and a cooling plate LCP for example in accordance with FIG. 1d. The surface element 100E further comprises an underlying radar suppressive element 190 arranged to absorb incident radio waves and consequently dampen reflection of incident radio waves such as radio waves generated by a radar system. Said radar suppressive element 190 is comprised of one or more layers, each comprising one or more radar absorbing materials (RAM) or surface layers for example as described in connection to FIG. 8c. The surface element 100E further comprises an intermediate insulation layer 131 arranged between the first heat conducting layer 80 and the radar suppressive element 190. The intermediate insulation layer 131 is arranged to provide insulation such that the heat developed in the radar suppressive element do not spread to the first heat conducting layer 80. The intermediate insulation layer 131, the radar suppressive element 190 and the liquid cooling element layer are arranged with an aperture arranged to receive the temperature generating element 150.

According to an embodiment said first insulation layer 131 is comprised of a material that enables transmittance of incident radio waves from a radar system.

According to an embodiment the first heat conducting layer 80 of said surface element 100E is arranged to be thermally conductive and frequency selective, for example in accordance to FIG. 8c-d. According to this embodiment the first heat conductive layer 80 is arranged to be frequency selective such that incident radio waves are transmitted/filtered through the heat conductive layer 80. This facilitated filtered radio waves to be absorbed by said underlying radar suppressive element 190. According to this embodiment said at least one temperature generating element is arranged on a first sub-surface 81 on the underside of the first heat conductive layer 80. According to this embodiment said first heat conducting layer 80 is arranged to provide an outer frequency selective sub-surface 82 that substantially surrounds said first sub-surface 81. By means of providing an application surface towards which said at least one temperature generating element 150 is applied that is free of frequency selective sub-surface a quicker and more effective heat conductibility of the first heat conducting layer 80 is facilitated.

Figure 8B:
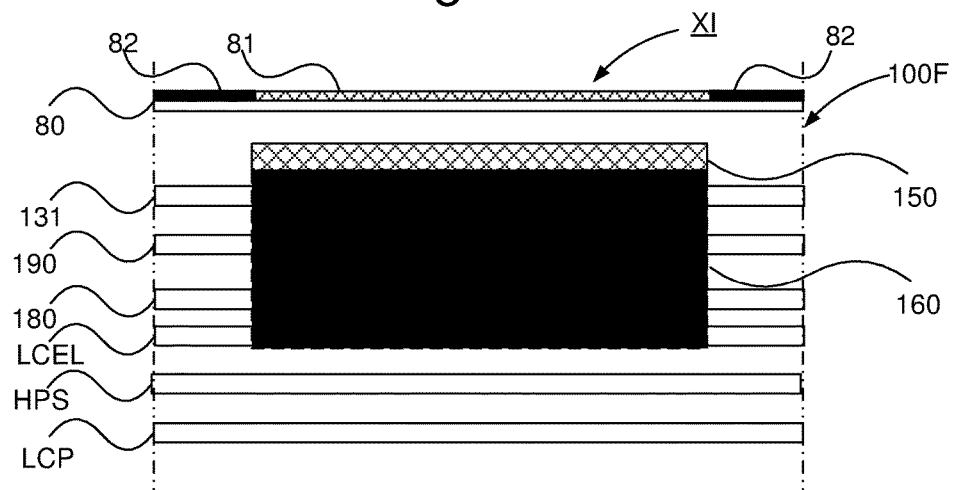
FIG. 8b schematically illustrates an exploded side view of different layers of part of a device according to an embodiment of the present invention.

FIG. 8b schematically illustrates an exploded side view of a part XI of the device for signature adaptation according to an embodiment of the present invention.

With reference to FIG. 8b a surface element 100F is shown. The surface element 100F differs from the configuration of the surface element 100E, exemplified with reference to FIG. 8a, in that the surface element 100F comprises an armouring layer 180. The armouring layer 180 is arranged to protect structures of the surface element, lying beneath the armouring layer 180, from direct fire, explosion and/or splinter. By means of providing an armouring layer of surface elements modular armouring is enabled for objects clad with a plurality of surface elements, wherein individual forfeited surface elements easily can be replaced. In more details the armouring layer 180 is arranged intermediate of the radar suppressive layer 190 and the liquid cooling element layer LCEL. The armouring layer 180 is also arranged to have a recess, such as through hole for receiving of the intermediate heat conducting layer 160.

According to an embodiment the armouring layer 180 is constituted by aluminium oxide such as for example AL2O3 or other similar material with good properties in terms of ballistic protection.

According to an embodiment the armouring layer 180 has a thickness in the range of 4-30 mm, e.g. 8-20 mm, wherein the thickness among others depending on application and desired efficiency.

According to an embodiment of the device according to the invention the heat conducting element 160 is formed of a material with good properties relating to heat conductibility and ballistic protection such as for example silicon carbide SiC.

According to an embodiment at least one of said heat conducting element 160 and the armouring layer 180 is formed by nano material.

The armouring layer 180 and/or the intermediate heat conducting element 160 may be arranged to provide ballistic protection at least according to the protection class as defined by NATO-standard, 7.62 AP WC ("STANAG Level 3").

According to an embodiment of the device according to the invention, the surface element comprises at least one electro-magnetic protective structure (not shown) arranged to provide protection against electro-magnetic pulses (EMP), which may be generated by weapon systems that aims to disable electronic systems. Said at least one electro-magnetic protection structure may for example be formed by a thin layer that absorbs/reflects electro-magnetic radiation such as for example a thin layer of aluminium foil or other suitable material.

According to an alternative embodiment one or more sub structures are arranged to provide a screening cage that enclose at least the control circuit.

According to an alternative embodiment the surface element is arranged to provide a screening cage and at least one thin layer arranged to absorb/reflect electro-magnetic radiation.

It should be appreciated that at least one of the surface elements 100E and 100F may be configured differently as compared to the configuration exemplified in FIGS. 8a and 8b. As an example at least one of the surface elements 100E and 100F may comprise a display surface 50, such as a display surface exemplified with reference to any of FIGS. 5a and 5b. Furthermore at least one of the surface elements 100E and 100F may comprise at plurality of temperature generating elements 150:5-150:7, such as exemplified with reference to FIGS. 2a and 2b. Furthermore at least one of the surface elements 100E and 100F may comprise a heat plate structure HPS such as exemplified with reference to FIGS. 2c and 2d. Furthermore at least one of the surface elements 100E and 100F may comprise a housing element 510, such as a housing element 510, exemplified with reference to FIG. 1d. In case at least one of the surface elements 100E or 100F comprises housing element 510, this housing element may be provided with a frequency selective functionality. Furthermore the surface element may be configured to comprise radar suppressive functionality.

FIG. 8c schematically illustrates a plan view of a structure of the device for signature adaptation according to an embodiment of the present invention.

With reference to FIG. 8c a frequency selective surface FSS is shown arranged in at least one element/layer of the device.

According to this embodiment the frequency selective surface FSS for example in accordance to FIG. 8a is integrated in the first heat conducting layer or in the first heat conducting layer 80 and the housing element 510.

The frequency selective surface FSS may for example be provided by formation of a plurality of resonant slit elements such as "patches" arranged in the housing element 510 and the first heat conducting layer 80 or arranged as trough structures STR extending through the housing element and the first heat conducting layer 80, wherein each of the through structures STR for example is formed as crossed dipoles. Said resonant slit elements are formed in a suitable geometrical pattern, for example in a periodic metallic pattern so that suitable electrical properties are reached. By configuring the form of respective plurality of resonant elements and the geometrical pattern formed by said plurality of resonant elements it is facilitated that incident radio waves (RF, "radio frequencies") generated by radar systems are filtered/transmitted through said frequency selective surface. As an example the frequency selective surface may be arranged to pass through radio waves of one or more frequencies, wherein said one or more frequencies is related to a frequency range, typically associated to radar systems such as of a frequency within the range of 0.1-100 GHz, e.g. 10-30 GHz.

According to this embodiment said plurality of resonant elements are formed as through structures arranged peripherally from the centre of said first heat conducting layer 80 and said housing element 510, such that these do not overlap underlying temperature generating element 150, whereby the heat conductibility from underlying temperature generating element 150 to upper structures of surface element is substantially un-affected.

According to this embodiment the device comprises a radar suppressing element 190 also referred to as a radar absorbing element 190. Said radar absorbing element 190 is arranged to absorb incident radio waves generated by radar systems.

According to an embodiment said plurality of resonant slit elements are shaped according to any of the following alternatives: quadratic, rectangular, circular, Jerusalem cross, dipoles, wires, crossed wires, two-periodic strips or other suitable frequency selective structure.

According to an embodiment said frequency selective surface FSS is arranged to be combined with at least one layer constituted by electrically controllable conductive polymers, whereby the frequency range that the frequency selective surface is arranged to pass through can be controlled by means of application of a voltage to said at least one layer of said electrically controllable conductive polymers.

According to an alternative embodiment one or more micro electro-mechanical system structures (MEMS) may be integrated into said frequency selective surface and wherein said one or more MEMS structure are arranged to control permeability of said frequency selective surface for radio waves within different frequency ranges.

According to an embodiment the radar absorbing element 190 has a thickness in the range of 0.1-5 mm, e.g. 0.5-1.5 mm, wherein the thickness among others depending on application and desired efficiency.

According to an embodiment said radar absorbing layer is formed by a layer covered with a paint layer comprising iron balls ("Iron ball paint"), comprising small spheres covered with carbonyl iron or ferrite. Alternatively said paint layer comprises both Ferro fluidic and non-magnetic substances.

According to an embodiment said radar absorbing element is formed by a material comprising a neoprene polymeric layer with ferrite granules or "carbon black" particles comprising a percentage portion of crystalline graphite embedded in the polymer matrix formed by said polymeric layer. The percentage portion of crystalline graphite may for example be in the range of 20-40% such as for example 30%.

According to an embodiment said radar absorbing element is formed by a foam material. As an example said foam material may be formed by urethane foam with "carbon black".

According to an embodiment said radar absorbing element is formed by a nano-material.

FIG. 8d schematically illustrates a plan view of temperature flows in a structure of the device for signature adaptation according to an embodiment of the present invention.

With reference to FIG. 8d it is shown a frequency selective surface FSS arranged in at least one element/layer of the device.

According to this embodiment the frequency selective surface FSS such as for example in accordance to FIG. 6a is integrated into the outer layer 80 or in the housing element 510. The resonant elements according to this embodiment are formed in a geometrical metallic pattern surrounding the application area 81 onto which said at least one thermoelectric element 150 is arranged such that a plurality of slits free of said plurality of resonant elements are formed. Said plurality of slits are arranged to extend along substantially straight lines along the surface of the first heat conducting layer and the housing element, wherein said plurality of slits extend from a central point of said application area. This facilitates efficient transport of heat along said plurality of slits out to the peripheral portions of said first heat conducting layer 80 and said housing element 510, wherein heat transport is illustrated with arrows E.

FIG. 9 schematically illustrates a plan view of a module element 500 according to an embodiment of the present invention.

According to this embodiment the module element 500 has a hexagonal shape. This facilitates simple and general adaption and assembly during composition of surface elements to a module system for example according to FIG. 11a-c. Further an even temperature may be generated on the entire hexagonal surface, wherein local temperature differences which may occur in corners of e.g. a squarely shaped module element are avoided.

The module element 500 comprises a control circuit 200 connected to the thermoelectric element 150, whereby the thermoelectric element 150 is arranged to generate a predetermined temperature gradient to a portion of the first heat conducting layer 80 of the module element 500, for example according to FIG. 6, wherein the predetermined temperature gradient is achieved by means of supplying a voltage from the control circuit to the thermoelectric element 150 wherein the voltage is based on temperature data or temperature information from the control circuit.

The module element 500 comprises an interface 570 for electrically connecting module elements for interconnection into a module system. The interface comprises according to an embodiment a connector 570.

The module element may be dimensioned as small as a surface of about 5 cm2, the size of the module element being limited by the size of the control circuit.

The surface of the module element/surface element 500 is according to an embodiment in the range of 25-2000 cm2, e.g. 75-1000 cm2. The thickness of the surface element is according to an embodiment in the range of 5-60 mm, e.g. 10-20 mm, the thickness among others depending on desired heat conduction and efficiency, and materials of the different layers/elements.

The module element and its layers have been described as flat. Other alternative implementations/configurations are also conceivable. Furthermore other configuration than those described regarding relative placement of the elements/layers of the module element is also conceivable. Furthermore other configurations than those that described regarding the number of element/layers and their respective functions are also conceivable.

The module element 500 further comprises a temperature sensing means 210, which according to an embodiment is constituted by a thermal sensor. The temperature sensing means 210 is arranged to sense the current temperature. According to a variant the temperature sensing means 210 is arranged to measure a voltage drop through a material being arranged outermost on the sensor, said material having such properties that it changes resistance depending on temperature. According to an embodiment the thermal sensor comprises two types of metals which in their boundary layers generate a weak voltage depending on temperature. This voltage arises from the Seebeck-effect. The magnitude of the voltage is directly proportional to the magnitude of this temperature gradient. Depending on which temperature range measurements are to be performed different types of sensors are more suitable than others, where different types of metals generating different voltages may be used. The temperature is then arranged to be compared to continuous information from a thermal sensing means arranged to sense/copy the thermal background, i.e. the temperature of the background. The temperature sensing means 210, e.g. a thermal sensor, is fixed on the upper side of the first heat conducting layer 80 and the temperature sensing means in the form of e.g. a thermal sensors may be made very thin and may according to an embodiment be arranged in the first heat conducting layer, e.g. the graphite layer, in which a recess for countersinking of the sensor according to an embodiment is arranged.

The thermoelectric element 150 is according to an embodiment arranged in a liquid cooling element layer LCEL which constitutes a part of a liquid cooling element, such as exemplified in FIG. 1d. The temperature sensing means 210 is according to an embodiment arranged in close proximity to the outer surface of the thermoelectric element 150. The thermoelectric element 150 is configured in such a way that when a voltage is applied, heat from one side of the thermoelectric element 150 transcends into the other side of the thermoelectric element 150. When the by means of the sensing means 210 sensed temperature when compared to the temperature information from the thermal sensing means differs from the temperature information, the voltage to the thermoelectric element 150 is arranged to be regulated such that actual values correspond to reference values, wherein the temperature of the module element 500 is adapted accordingly by means of the thermoelectric element 150.

It should be appreciated that the module element 500 may be configured differently as compared to the module element 500 illustrated in FIG. 9. For example the module element may comprise a display surface 50, such as exemplified with reference to FIG. 5*a*. Furthermore the module element may comprise more components such as illustrated with reference to any of FIGS. 1*a-b*, 1*d-e*, 2*a-b*, 5*a-b* or 8*a-d*.

FIG. 10 schematically illustrates a device XII for signature adaptation according to an embodiment of the present invention.

The device comprises a control circuit 200 or control unit 200 and a surface element 100A-F for example a surface element 100A according to FIG. 1*a*, wherein the control circuit is coupled to the surface element 100A. The device comprises a thermoelectric element 150. Said thermoelectric element 150 is arranged to receive a voltage from the control circuit 200 wherein the thermoelectric element 150 in accordance with the above is configured such that when a voltage is supplied, heat transcends from one side of the thermoelectric element 150 to the other side of the thermoelectric element.

The device according to this embodiment comprises a temperature sensing means 210 arranged to sense the current temperature of the surface element 500. The temperature sensing means is according to an embodiment, as shown in for example FIG. 6, arranged on or in proximity to the outer surface of the thermoelectric element 150 such that the sensed temperature corresponds to the outer temperature of the surface element 100A.

The control circuit 200 comprises a thermal sensing means 610 arranged to sense temperature such as background temperature. The control circuit 200 further comprises a software unit 620 arranged to receive and process temperature data from the thermal sensing means 610. The thermal sensing means 610 is consequently connected to the software unit 620 via a link 602 wherein the software unit 620 is arranged to receive a signal representing background data.

In case the module element 500 comprises at least one display surface 50 said at least one display surface is arranged to receive a voltage/current from the control circuit 200, wherein the display surface 50 in accordance with the above is configured such that when a voltage is applied at least one spectrum is radiated from one side of the display surface 50. In this case the control circuit 200 also comprises a visual sensing means arranged to sense visual structure such as one or more visual structures descriptive of objects in the surrounding of the device. Said software unit 620 is arranged to receive and process visual structure data comprising one or more images/image sequences. The visual sensing means 615 is consequently connected to the software unit 620 via a link 599 wherein the software unit 620 is arranged to receive a signal representing background visual structure data.

The software unit 620 is further arranged to receive instructions from a user interface 630 with which it is arranged to communicate. The software unit 620 is connected to the user interface 630 via a link 603. The software unit 620 is arranged to receive a signal from the user interface via the link 603, said signal representing instruction data, i.e. information of how the software unit 620 by means of software should process temperature data from the thermal sensing means 610 and visual structure data from the visual sensing means 615. The user interface 630 may e.g. when the device is arranged on e.g. a military vehicle and intended for thermal and visual camouflaging and/or adaptation with a specific thermal and/or visual pattern of said vehicle be configured such that an operator, from an estimated direction of threat, may chose to focus available power of the device to achieve the best imaginable signature to the background. This is elucidated in more detail in FIG. 14.

According to this embodiment the control circuit 200 further comprises an analogue/digital converter 640 connected via a link 604 to the software unit 620. The software unit 620 is arranged to receive a signal via the link 604, said signal representing information packages from the software unit 620 and arranged to convert the information packages, i.e. information communicated from the user interface 630 and processed temperature data. The user interface 630 is arranged to determine from the or from which ever direction of threat that has been selected, which camera/video-camera/IR-camera/sensor that shall deliver the information to the software unit 620. According to an embodiment all the analogue information is converted in the analogue/digital converter 640 to binary digital information via standard A/D-converters being small integrated circuits. Hereby no cables are required. According to an embodiment described in connection to FIG. 11*a-c* the digital information is arranged to be superimposed on a current supplying framework of the vehicle.

The control loop 200 further comprises a digital information receiver 650 connected to the digital/analogue converter 640 via a link 605. From the software unit 620, analogue information is sent to the digital/analogue converter 640 where information about which temperature (desired value) each surface element shall have registered. All this is digitalized in the digital/analogue converter 640 and sent according to standard procedure as a digital sequence comprising unique digital identities for each surface element 500 with associated information about desired value etc. This sequence is read by the digital information receiver 650 and only the identity corresponding to what is pre-programmed in the digital information receiver 650 is read. In each surface element 500 a digital information receiver 650 with a unique identity is arranged. When the digital information receiver 650 senses that a digital sequence is approaching with the correct digital identity it is arranged to register the associated information and remaining digital information is not registered. This process takes place in each digital information receiver 650 and unique information to each surface element 500 is achieved. This technique is referred to as CAN technique.

The control circuit further comprises a temperature control circuit 600 connected via a link 605 to the analogue/digital converter 640. The temperature control circuit 600 is arranged to receive a digital signal in the form of digital trains representing temperature data via the link 605.

The temperature sensing means 210 is connected to the temperature control circuit via a feedback link 205, wherein the temperature control circuit 600 is arranged to receive a signal representing temperature data sensed by means of the temperature sensing means 210 via the link 205.

The temperature control circuit 600 is connected to the thermoelectric element via links 203, 204 for supply of voltage to the thermoelectric element 150. The temperature control circuit 600 is arranged to compare temperature data from the temperature sensing means 210 with temperature data from the thermal sensing means 610, wherein the control circuit 600 is arranged to send a current to/apply a voltage, over the thermoelectric element 150, that corresponds to the difference in temperature so that the temperature of the surface element 500 is adapted to the background temperature. The temperature sensed by means of the temperature sensing means 210 is consequently arranged to be compared with continuous temperature information from the thermal sensing means 610 of the control circuit 200.

The temperature control circuit 600 according to this embodiment comprises the digital information receiver 650, a so called PID-circuit 660 connected to the digital information receiver 650 via a link 606, and a regulator 670 connected via a link 607 to the PID-circuit. In the link 606 a signal representing specific digital information is arranged to be sent in order for each surface element 500 to be controllable such that desired value and actual value correspond.

The regulator 670 is then connected to the thermoelectric 150 via the links 203, 204. The temperature sensing means 210 is connected to the PID-circuit 660 via the link 205, wherein the PID-circuit is arranged via the link 205 to receive the signal representing temperature data sensed by means of the temperature sensing means 210. The regulator 670 is arranged via the link 607 to receive a signal from PID-circuit 660 representing information to increase or decrease current supply/voltage to the thermoelectric element 150.

In case the module element 500 comprises at least one display surface the control circuit further comprises a digital information receiver 655 connected to the digital/analogue converter 640 via a link 598. From the software unit 620, analogue information is sent to the digital/analogue converter 640 where the information relates to information regarding which visual structure each surface element shall have registered. All this is digitalized in the digital/analogue converter 640 and sent according to standard procedure as a digital sequence comprising unique digital identities for each surface element 500 with associated information about desired value etc. This sequence is read by the digital information receiver 655 and only the identity corresponding to what is pre-programmed in the digital information receiver 655 is read. In each surface element 500 a digital information receiver 655 with a unique identity is arranged. When the digital information receiver 655 senses that a digital sequence is approaching with the correct digital identity it is arranged to register the associated information and remaining digital information is not registered. This process takes place in each digital information receiver 655 and unique information to each surface element 500 is achieved. This technique is referred to as CAN technique. In this case the control circuit further comprises an image control circuit 601 connected to the digital/analogue converter 640 via a link 598. The image control circuit 601 is arranged to receive a digital signal in the form of digital trains representing visual structure data such as data representing one or more images/image sequences via the link 598.

The image control circuit 601 is connected to the display surface 50 via links 221, 222 for supply of voltage to the display surface 50. The image control circuit 601 is arranged to receive visual structure data from said visual sensing means and store said visual structure data in at least one memory buffer, wherein the image control circuit 601 is arranged to continuously read said memory buffer at a predetermined time interval and send at least one signal/current to/apply at least one voltage over the display surface 50 that correspond to desired light intensity/reflection property of each of the sub elements S1-S4 of each picture element P1-P4 so that the at least one spectrum radiated of the surface of the surface element 500 is adapted to the visual background structure that is described by said visual structure data.

The image control circuit 601 according to this embodiment comprises the digital information receiver 655, a image control device 665 connected to the digital information receiver 655 via a link 625 and a image regulator 675 connected to the image control device 665 via a link 626. The image control device 665 comprises at least data processing means and a memory unit. The image control device 665 is arrange to receive data from the digital information receiver 655 and store this data in a memory buffer of said memory unit. The image control device is further arranged to process data stored in said memory buffer such as for example by means of in a predetermined update frequency implementing a Look-Up-Table (LUT) or other suitable algorithm that maps data stored in the memory buffer to individual picture elements P1-P4 and/or sub elements S1-S4 of the display surface 50 of the surface element 500. In the link 625 a signal representing specific digital information is arranged to be sent in order for the display surface 50 of surface element 500 to be controllable such that radiated at least one spectrum from the display surface 50 and registered data from the digital information receiver correspond. In the link 626 a signal representing specific digital information is arranged to be sent in order for the respective picture element P1-P4 and/or sub elements S1-S4 of the display surface 50 of surface element 500 to be controllable such that the radiated at least one spectrum from the display surface 50 and registered data from the digital information receiver correspond.

The image regulator 675 is then connected to the display surface 50 via the links 221, 222. The image regulator 675 is arranged via the link 626 to receive a signal from image control device 655 representing information to increase or decrease current supply/voltage to the respective picture elements P1-P4 and/or sub elements S1-S4 of the display surface 50. The image regulator 675 is further arranged to send one or more signals to the display surface 50 via the links 221, 222 in dependence of the received signal from the image control device 655. Said one or more signals arranged to be sent to the display surface 50 from the image regulator may comprise one or more of the following signals: pulse modulated signals, pulse amplitude modulated signals, pulse width modulated signals, pulse code modulated signals, pulse displacement modulated signals, analogue signals (current, voltage), combinations and/or modulations of said one or more signals.

The thermoelectric element 150 is configured in such a way that when the voltage is applied, heat from one side of the thermoelectric element 150 transcends to the other side of the thermoelectric element 150. When the temperature sensed by means of the temperature sensing means 210 by comparison with the temperature information from the thermal sensing means 210 differs from the temperature information from the thermal sensing means 610 the voltage to the thermoelectric element 150 is arranged to be regulated such that actual value and desired value correspond, wherein the temperature of the surface of the surface element 500 is adapted accordingly by means of the thermoelectric element.

According to an embodiment the thermal sensing means comprises at least one temperature sensor such as a thermometer arranged to measure the temperature of the surrounding. According to another embodiment the thermal sensing means 610 comprises at least one IR-sensor arranged to measure the apparent temperature of the background, i.e. arranged to measure an average value of the background temperature. According to yet another embodiment the thermal sensing means 610 comprises at least one IR-camera arranged to sense the thermal structure of the background. These different variants of thermal sensing means described in more detail in connection to FIG. 11*a-c*.

According to an embodiment said temperature control circuit 600 is arranged to send temperature information relating to actual and/or desired values to the software unit 620. According to this embodiment said software unit 620 is arranged to process actual and/or desired values together with characteristics descriptive of response times for temperature control in order to provide temperature compensation information. Where said temperature compensation information is sent to the image control circuit 601 that is arranged to provide information causing said at least one display surface 50 to radiate at least one wave length component that falls within the infrared spectrum apart from providing at least one spectrum corresponding to the visual structure of the background. This facilitates improved response time related to achieving thermal adaptation.

According to an embodiment the control circuit 200 comprise a distance detection means (not shown) such as a laser range finder arranged to measure distance and angle to one or more objects in the surroundings of the device. Said software unit 620 is arranged to receive and process distance data and angular data from the distance detection means. The distance detection means is consequently connected to the software unit 620 via a link (not shown), wherein the software unit is arranged to receive a signal representing distance data and angular data. Said software unit 620 is arranged to process temperature data and visual structure data by relating temperature data and visual structure data to distance data and angular data such as associating distance and angle to objects in the background. Said software unit 620 is further arranged to apply at least one transform such as a perspective transform based on said temperature data and visual structure data with associated related distance and angle in combination with data describing characteristics of said thermal sensing means and said visual sensing means. Hereby it is enabled to provide projections of at least one selected object/structures of temperature and/or visual structure with a modified perspective and/or distance. This may for example be used to generate a fake signature such as described with reference to FIG. 14 so that reproduction of the object desired to be resembled may be modified so that distance to the object and the perspective of the object changes relative to the distance and perspective that the thermal sensing means and/or the visual sensing means perceives.

According to this embodiment the user interface 630 may be arranged to provide an interface that enables an operator to select at least one object/structure that is desired to be reproduced visually and thermally. In order to enable modifications of perspectives the software unit 620 may further be arranged to register and process data describing distance and angle to objects/structures over a period of time, during which said device or object/structures a are positioned so that at least of each other independent different views of said objects/structures are perceived by said thermal sensing means and/or said visual sensing means.

In case the surface element 500 comprises a radar absorbing element, such as for example according to FIG. 8*a-b*, the control circuit according to an embodiment is arranged to communicate wirelessly. By providing at least one wireless transmitter- and receiver-unit and by utilizing at least one resonant slit element STR of the frequency selective surface structure as antenna wireless communication is enabled. According to this embodiment the control circuit may be arranged to communicate on a short-wave frequency range such as for example on a 30 GHz band. This facilitates reducing the number of links associated to communication of data/signals in said control circuit and/or in the support structure/framework such described with reference to FIG. 11*d*.

The configuration of the control circuit may differ from the configuration described with reference to FIG. 10. The control circuit may for example comprise more or fewer sub components/links. Further one or more parts may be arranged externally of the control circuit 200, such as arranged in an external central configuration where for example the user interface 630, the software unit 620, the digital/analogue converter 640, the temperature sensing means 610 and the visual sensing means 615 are arranged to provide data and process data for at least one surface element 500, comprising a local control circuit, comprising said temperature control circuit 600 and said image control circuit 601 communicatively connected to said centrally configured digital/analogue converter. Furthermore in case the module element 500 comprises a plurality of temperature generating elements 150:5-150:7, such as exemplified with reference to FIGS. 2*a* and 2*b*, the control circuit may be arranged to control each of said plurality of temperature generating elements 150:5-150:7. These may then by means of the control circuit be controlled individually and/or in unison by means of supplying the same voltage/current to one or more sets of temperature generating elements 150: 5-150:7 of the module element, wherein said plurality of sets may comprise two or more predetermined temperature generating elements. Alternatively a plurality of control circuits, such as a plurality of control circuits 200 may be arranged in each respective module element, wherein each of said control circuits are arranged to control voltage/current supplied to a temperature generating element of said plurality of temperature generating elements.

According to an embodiment the control circuit 200 is configured to coupling to a pump control circuit such as to said pump control circuit PCC exemplified with reference to FIG. 1*c*. This facilitates exchange of information between the control circuit 200 and the pump control circuit. Wherein said information may comprise information describing current parameters of for example flow and temperature which may be used by the control circuit to control the temperature by means of the temperature generating element or the temperature generating elements and/or where the above mentioned information bay be used by the pump control circuit PCC to control the flow to and from the liquid cooling plates LCP of a respective module element 500.

FIG. 11*a* schematically illustrates parts XIII-a of a module system 700 comprising surface elements element 500 or module elements 500 for recreation of thermal background or similar; FIG. 11*b* schematically illustrates an enlarged part XIII-b of the module system in FIG. 11*a*, and FIG. 11*c* schematically illustrates an enlarged part XIII-c of the part in FIG. 11*b*.

The individual temperature regulation and/or visual control is arranged to occur in each module element 500 individually by means of a control circuit, e.g. the control circuit in FIG. 11, arranged in each module element 500. Each module element 500 is according to an embodiment comprised by the module element described in FIG. 9.

The respective module element 500 has according to this embodiment a hexagonal shape. In FIG. 11*a-b* the module elements 500 are illustrated with a checked pattern. The module system 700 comprises according to this embodiment a framework 710 arranged to receive respective module element. The framework according to this embodiment has a honeycomb configuration, i.e. is interconnected by means of a number of hexagonal frames 712, the respective hexagonal frame 712 being arranged to receive a respective module element 500.

The framework 710 is according to this embodiment arranged to supply current. Each hexagonal frame 712 is provided with an interface 720 comprising a connector 720 by means of which the module element 500 is arranged to be electrically engaged. Digital information representing background temperature sensed by means of the thermal sensing means according to e.g. FIG. 11 is arranged to be superimposed on the frame work 710. As the framework itself is arranged to supply current the number of cables may be reduced. In the framework current will be delivered to each module element 500 but at the same time also, superposed with the current, a digital sequence containing unique information for each module element 500. In this way no cables will be needed in the framework.

The framework is dimensioned for in height and surface receiving module elements 500.

A digital information receiver of respective module element such as described in connection to FIG. 10 is then arranged to receive the digital information, wherein a temperature control circuit and an image control circuit according to FIG. 10 is arranged to regulate as described in connection to FIG. 10.

According to an embodiment the device is arranged on a craft such as a military vehicle. The framework 710 is then arranged to be fixed on e.g. the vehicle wherein the framework 710 is arranged to supply both current and digital signals. By arranging the framework 710 on the body of the vehicle the framework 710 at the same time provides fastening to the body of the craft/vehicle, i.e. the framework 710 is arranged to support the module system 700. By using the module element 500 the advantage is among others achieved that if one module element 500 would fail for some reason only the failed module element needs to be replaced. Further the module element 500 facilitates adaptation depending on application. A module element 500 may fail depending on electrical malfunctions such as short-circuits, outer affection and due to damages of splinter and miscellaneous ammunition.

Electronics of respective module element is preferably encapsulated in respective module element 500 such that induced electrical signals in e.g. antennas are minimized.

The body of e.g. the vehicle is arranged to function as ground plane 730 while the framework 710, preferably the upper part of the framework is arranged to constitute phase. In FIG. 11*b-c* I is the current in the framework, Ti a digital information containing temperatures and visual structures to the module element I, and D is deviation, i.e. a digital signal telling how big difference it is between desired value and actual value for each module element. This information is sent in the opposite direction since this information should be shown in the user interface 630 according to e.g. FIG. 10 such that the user knows how good the temperature adaptation of the system is for the moment.

A temperature sensing means 210 according to e.g. FIG. 10 is arranged in connection to the thermoelectric element 150 of each respective module element 500 to sense the outer temperature of the respective module element 500. The outer temperature is then arranged to be continuously compared with background temperature sensed by means of the thermal sensing means such as described above in connection to FIG. 10. When these differ, means such as a temperature control circuit described in connection to FIG. 10, is arranged to regulate the voltage to the thermoelectric element of the module element such that actual values and desired values correspond. The degree of signature efficiency of the system, i.e. the degree of thermal adaptation that may be achieved, depends on which thermal sensing means, i.e. which temperature reference, that is used—temperature sensor, IR-sensor or IR-camera.

As a result of the thermal sensing means according to an embodiment being constituted by at least one temperature sensor such as a thermometer arranged to measure the temperature of the surrounding, a less precise representation of the background temperature, but a temperature sensor has the advantage that it is cost efficient. In application with vehicles or the like temperature sensor is preferably arranged in air intake of the vehicle in order to minimize influence of heated areas of the vehicle.

As a result of the thermal sensing means according to an embodiment being constituted by at least one IR-sensor arranged to measure the apparent temperature of the background, i.e. arranged to measure an average value of the background temperature a more correct value of the background temperature is achieved. An IR-sensor is preferably placed on all sides of a vehicle in order to cover different directions of threat.

As a result of the thermal sensing means according to an embodiment being constituted by an IR-camera arranged to sense the thermal structure of the background, an almost perfect adaptation to the background may be achieved, the temperature variations of a background being representable on e.g. a vehicle. Here, a module element 500 will correspond to the temperature which the set of pixels occupied by the background at the distance in question. These IR-camera pixels are arranged to be grouped such that the resolution of the IR-camera corresponds to the resolution being representable by the resolution of the module system, i.e. that each module element correspond to a pixel. Hereby a very good representation of the background temperature is achieved such that e.g. heating of the sun, snow stains, water pools, different emission properties etc. of the background often having another temperature than the air may be correctly represented. This efficiently counteracts that clear contours and large evenly heated surfaces are created such that a very good thermal camouflaging of the vehicle is facilitated and that temperature variations on small surfaces may be represented.

As a result of the visual sensing means according to an embodiment being constituted by a camera, such as a video camera, arranged to sense the visual structure (colour, pattern) of the background, an almost perfect adaptation to the background may be achieved, the visual structure of a background being representable on e.g. a vehicle. Here, a module element 500 will correspond to the visual structure which the set of pixels occupied by the background at the distance in question. These video camera pixels are arranged to be grouped such that the resolution of the video camera corresponds to the resolution being representable by the resolution of the module system, i.e. that each respective module element correspond to a number of pixels (picture elements) defined by the number of picture element that are arranged on the display surface of respective module elements. Hereby a very good representation of the background structure is achieved so that for example even relatively small visual structures that are picked up by the video camera are reproduced correctly. One or more video cameras are preferably positioned on one or more sides of a vehicle in order to cover reproduction seen from several different threat directions. In the cases where the display surface is configured to be directionally dependent, such as for example according to FIG. 7d-e, the visual structure sensed by the visual sensing means at different angles may be used to individually control picture elements adapted for image reproduction in different observation angles so that these reproduce the visual structure that correspond to the direction in which it is sensed by the visual sensing means.

Figure 11D:
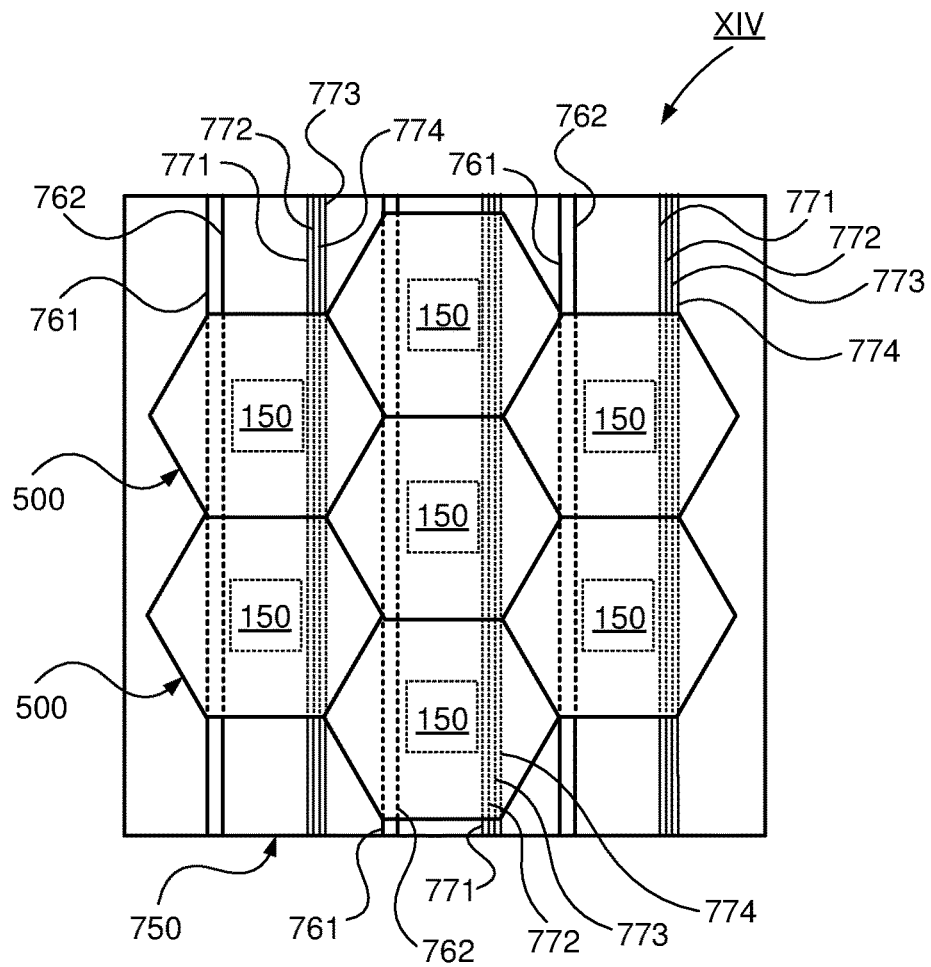
FIG. 11d schematically illustrates a plan view of a module system comprising elements for recreating thermal and/or visual background or similar according to an embodiment of the present invention.
Figure 11E:
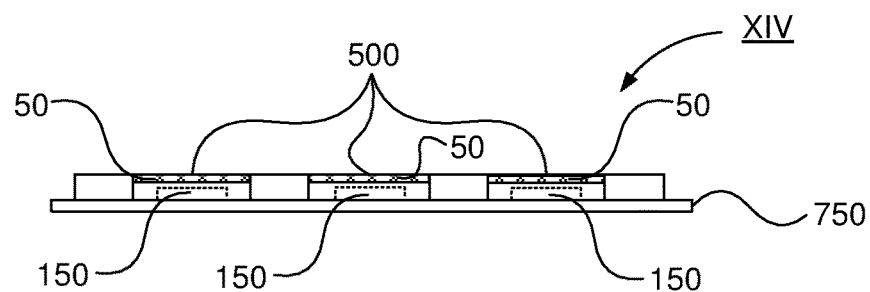
FIG. 11e schematically illustrates a side view of the module system in FIG. 11d.

FIG. 11d schematically illustrates a plan view of a module system XIV or a part of a module system VII comprising surface elements for signature adaptation according to an embodiment of the present invention, and FIG. 11e schematically illustrates a side view of the module system VII in FIG. 11d.

The module system XIV according to this embodiment differs from the module element 700 according to the embodiment illustrated in FIG. 11a-c in that instead of a support structure constituted by a framework 710, a support structure 750 constituted by one or more support members 750 or support plates 750 for supporting interconnected module elements 500 is provided.

The support structure may thus be formed by one support member 750 as illustrated in FIG. 11d-e, or a plurality of interconnected support members 750.

The support member is made of any material fulfilling thermal demands and demands concerning robustness and durability. The support member 750 is according to an embodiment made of aluminium, which has the advantage that it is light and is robust and durable. Alternatively the support member 750 is made of steel, which also is robust and durable.

The support member 750 having a sheet configuration has according to this embodiment an essentially flat surface and a square shape. The support member 750 could alternatively have any suitable shape such as rectangular, hexagonal, etc.

The thickness of the support member 750 is in the range of 5-30 mm, e.g. 10-20 mm.

Interconnected module elements 500 comprising one or more temperature generating elements 150 or one or more temperature generating elements 150 and a display surface 50 as described above are arranged on the support member 750. The support member 750 is arranged to supply current. The support member 750 comprises links 761, 762, 771, 772, 773, 774 for communication to and from each single module element, said links being integrated into the support member 750.

According to this embodiment the module system comprises a support member 750 and seven interconnected hexagonal module elements 500 arranged on top of the support member 750 in such a way that a left column of two module elements 500, an intermediate column of three module elements 500 and a right column of two module elements 500 is formed. One hexagonal module element is thus arranged in the middle and the other six are arranged around the middle module element on the support member 750.

According to this embodiment current supply signals and communication signals are separated and not superimposed, which results in the communication bandwidth being increased, thus speeding up the communication rate. This simplifies change in signature patterns due to the increased bandwidth increasing the signal speed of the communication signals. Hereby also thermal and visual adaptation during movement is improved.

By having current signals and communication signals separated interconnection of a large number of module elements 500 without affecting the communication speed is facilitated. Each support member 750 comprises several links 771, 772, 773, 774 for digital and/or analogue signals in combination with two or more links 761, 762 for power supply.

According to this embodiment said integrated links comprises a first link 761 and a second link 762 for supply of current to each column of module elements 500. Said integrated links further comprises third and fourth links 771, 772 for information/communication signals to the module elements 500, said signals being digital and/or analogue, and fifth and sixth links 773, 774 for information/diagnostic signals from the module elements 500, said signals being digital and/or analogue.

By having two links, third and fourth links 771, 772, for providing information signals to the module elements 500 and two links, fifth and sixth links 773, 774, for providing information signals from the module elements 500 the communication speed becomes essentially unlimited, i.e. occurs momentarily.

Figure 12A:
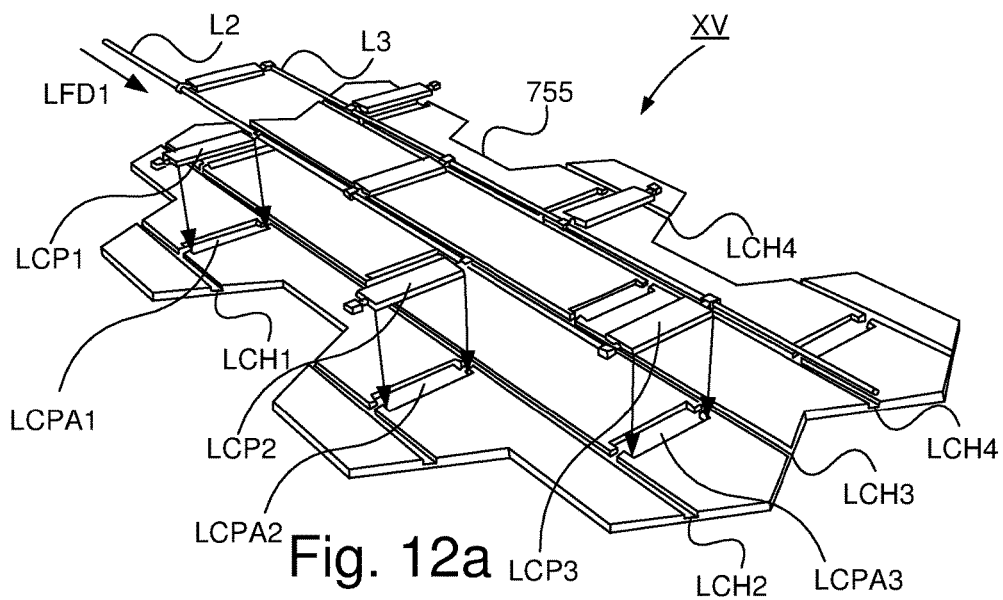
FIG. 12a schematically illustrates an exploded perspective view of a module system according to an embodiment of the present invention.
Figure 12B:
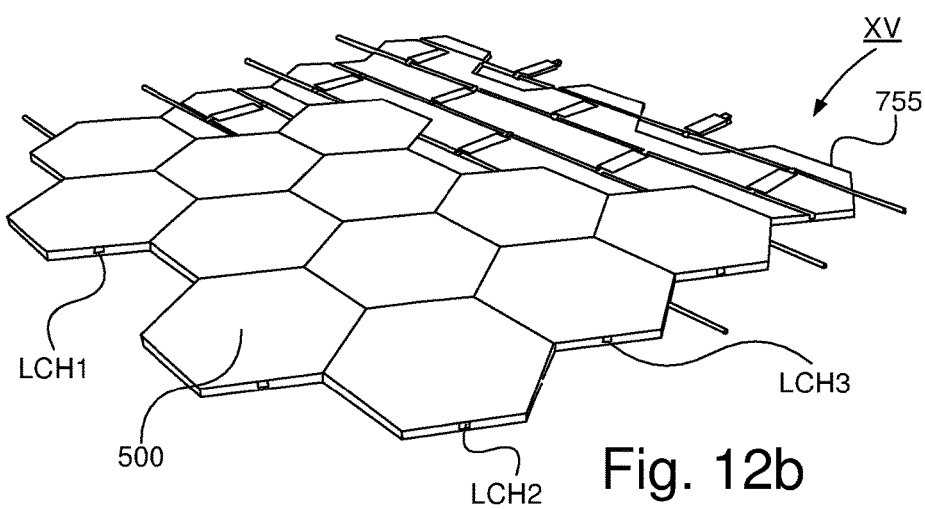

FIG. 12a schematically illustrates an exploded perspective view of a module system or a part XV of a device for signature adaptation according to a preferred embodiment of the present invention and FIG. 12b schematically illustrated partly cut perspective view of the part XV illustrated in FIG. 12a with applied module elements.

With reference to FIG. 12a a framework 755 is shown arranged to receive a plurality of liquid cooling plates coupled in parallel of a plurality of module elements, such as a plurality of module elements 500 exemplified with reference to FIG. 9, together with a plurality of conduits associated to said plurality of liquid cooling plates. In FIG. 12a the arrows illustrates assembly instructions for each respective liquid cooling plate LCP1-LCP3 to be coupled in parallel. The framework comprises a plurality of recesses in the form of a first set of recesses LCPA1-LCPA3, wherein each recess of said first set of recesses is arranged to receive a liquid cooling plate, such as a liquid cooling plate LCP exemplified with reference to FIGS. 3a and 3b. The framework further comprises a second set of recesses LCH1-LCH4, arranged as passage ways, each being arranged to receive a conduit. Wherein said conduit may comprise at least one of the second L2 and third conduit L3, such as exemplified with reference to FIG. 1c in order to provide a liquid flow to and from each of said cooling plates via said pump PU. Said conduit may also be a conduit that comprises a manifold of said second or third conduit L2, L3. In more detail said second and third conduit are configured to be coupled respectively to said first LCPF1 and second flow passage element LCPF2, such as exemplified with reference to FIG. 3a. As an example the direction of the inflow via said second conduit L2 may be configured as illustrated by the arrow with reference LFD1. Each of said plurality of liquid cooling plates coupled in parallel is arranged to be applied to a heat plate, such as said centrally placed heat plate HP6 of said liquid cooling element layer exemplified with reference to FIG. 2d.

Module elements 500 are inter-connectable into a framework, for example in accordance with FIG. 12a or 12b, by means of suitable type of fastening means.

The framework for example according to FIG. 12a or 12b are inter-connectable to other frameworks of these types, where in the frameworks are interconnected electrically/mechanically via connection points (not shown), for example via connection points according to FIG. 11a, for electrical connection of support elements via the links. Hereby the number of connections points is reduced.

The framework 755 having a sheet configuration has according to this embodiment an essentially flat surface and a square shape. T The framework 755 could alternatively have any suitable shape such as rectangular, hexagonal, etc. For example the edges of the framework may be shaped with a plurality of protrusions having a direction of extension along the plane of the framework adapted for a subsurface of a module element 500.

Interconnected frameworks for example according to FIG. 12a or 12b, shaping a support structure is intended to be arranged on a structure of a craft such as for example a vehicle, a ship or similar.

According to an embodiment the framework 755 comprises a plurality of integrated links (not shown), wherein each integrated link comprises a plurality of links for information/diagnostic/communication signals of digital/analogue type to and from connected module elements 500. Each of said plurality of links is arranged to provide communication to and from a column of module elements 500. Said plurality of integrated links may be constituted by thin film, wherein said thin film is arranged at the support element 755.

According to an embodiment said module elements 500 coupled said framework are instead arranged to communicate wirelessly, for example as described in connection to FIG. 10. Said wireless communication may for example be arranged to form a mesh-net or mesh-network which provides higher redundancy and reduces the requirements associated to range for the wireless communication since the mesh-network enables each node in the network, i.e. each module element 500, to have contact with at least two other nodes i.e. module elements. Said at least two other nodes may for example be two neighbouring nodes (module elements), such as all other neighbouring nodes in close proximity to a module element. According to this example the mesh-network may be based on at least one of the following communication protocols Bluetooth, ZigBee and IEEE 802.11.

It should be appreciated that the frame work may be configured differently as compared to the framework illustrated in FIGS. 12a and 12b. For example more or fewer module elements may be arranged to be interconnected into this framework. This may also mean that dimensioning of module elements and/or framework may be different. Further, more or fewer recesses LCH1-LCH4 may be arranged in the framework, in which more or fewer conduits may be arranged to propagate.

Figure 12C:
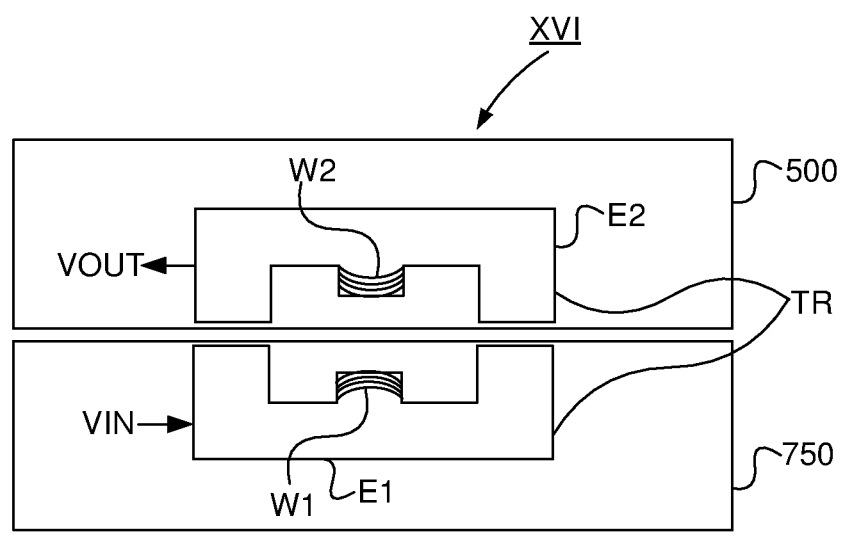
FIG. 12c schematically illustrates a side view of part of a device according to an embodiment of the present invention.

FIG. 12c schematically illustrates a side view of a part XVI of a device for signature adaptation according to an embodiment of the present invention.

With reference to FIG. 12c a module element 500, is shown, configured for connection to a support element or framework 750, 755, such as a support element or framework exemplified with reference to any of FIG. 11d-11e or 12a-12b, wherein supply of power to the components of the module system is accomplished by means of a transformer TR. A primary transformer section E1 of the transformer is arranged in the framework 750 and a secondary transformer section E2 of the transformer is arranged in the module element 500, opposite to and facing said primary transformer section E1. Said primary transformer section comprises a primary winding W1 and said secondary transformer section comprises a secondary winding W2. By means of supplying a voltage/current VIN to said primary winding said voltage/current is transferred by means of induction to said secondary winding whereby a voltage/current is made available for the module element 500. Voltage/current VIN may for example be provided from an electric generator of the vehicle to which the module elements and the associated framework is connected and voltage/current VOUT may be arranged to be supplied to the control circuit of the module element, such as the control circuit 200 exemplified with reference to FIG. 6 or 10.

According to this embodiment each respective module element 500 is arranged to be connected to the framework such that the secondary transformer section of the module elements in enabled to inductively contact the primary transformer section arranged in the framework. This may for example be accomplished by means of performing fastening such that both transformer sections with associated legs are arranged substantially opposite and facing each other.

According to an embodiment the transformer TR is comprised of an iron core transformer, such as a shell type transformer of E-E type, wherein the windings of the transformer are arranged surrounding a centrally placed leg of the respective transformer section E1, E2 and wherein the transformer sections are constructed by means of a plurality of joined laminate layers, such as a plurality of punched laminate layers each shaped as an "E".

The above described solution for current supply to each respective module is particularly advantageous for marine crafts since this solution reduces the risk of short-circuit and that lower levels of electromagnetic radiation is generated and transmitted to the surroundings, which may be intercepted by enemy troop.

Figure 13:
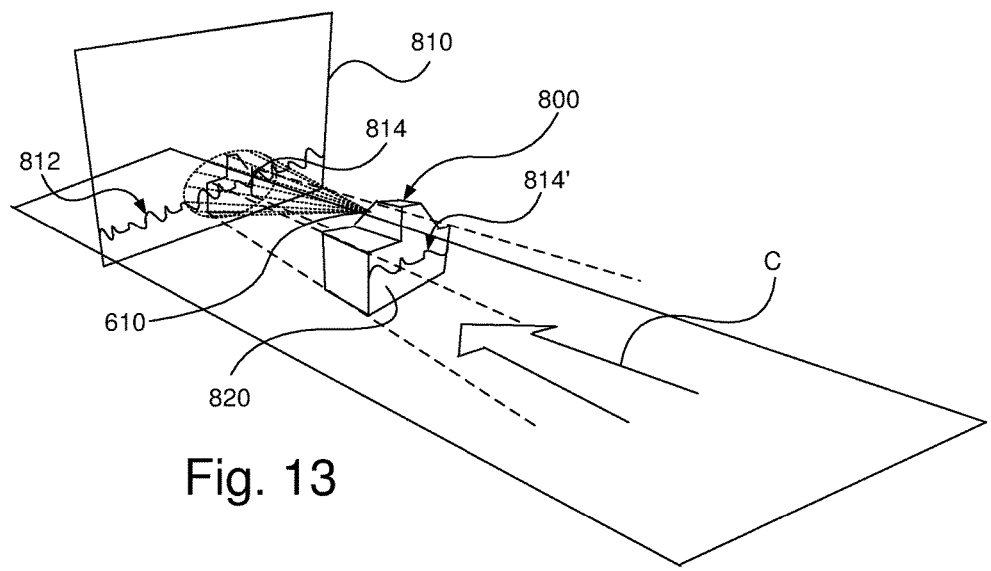
FIG. 13 schematically illustrates an object such a vehicle subjected to a threat in a direction of threat, wherein the thermal and/or visual structure of the background by means of the device according to the present invention being recreated on the side of the vehicle facing in the direction of threat.

FIG. 13 schematically illustrates an object 800 such as a vehicle 800 subjected to threat in a direction of threat, wherein the thermal structure 812 or thermal and visual structure of the background 810 by means of the device according to the present invention is recreated on a side of the vehicle facing the direction of threat. The device according to an embodiment comprises the module system according to FIG. 11a-c wherein the module system is arranged on the vehicle 800.

The estimated direction of threat is illustrated by means of the arrow C. The object 800, e.g. a vehicle 800, constitute a target. The threat may e.g. be constituted by a thermal/visual/radar reconnaissance and surveillance system, a heat seeking missile or similar arranged to lock on the target.

Seen in the direction of threat a thermal and/or visual background 810 is present in the extension of the direction C of threat. The part 814 of this thermal and/or visual background 810 of the vehicle 800 being viewed from the threat is arranged to be copied by means of a thermal sensing means 610 and/or the visual sensing means 615 according to the invention such that a copy 814' of that part of the thermal and/or visual background, according to a variant the thermal and/or visual structure 814', is seen by the threat. As described in connection to FIG. 10 the thermal sensing means 610 according to a variant comprises an IR-camera, according to a variant an IR-sensor and a variant a temperature sensor, where IR-camera provides the best thermal representation of the background. As described in connection to FIG. 10 the visual sensing means 615 according to a variant comprises a video camera.

The thermal and/or visual background 814', thermal and/or visual structure of the background sensed/copied by means of the thermal/visual sensing means, is arranged to be interactively recreated on the side of the target, here vehicle 800, facing the threat, by means of the device, such that the vehicle 800 thermally melt into the background. Hereby the possibility for detection and identification from threats, e.g. in the form of binoculars/image intensifiers/cameras/IR-cameras or a heat seeking missile locking at the target/vehicle 800 is rendered more difficult since it thermally and visually blends into the background.

As the vehicle moves the copied thermal structure 814' of the background will continuously be adapted to changes in the thermal background due to the combination of heat conducting layers with anisotropic heat conductibility, insulation layer, thermoelectric element and continuously registered difference between thermal sensing means for sensing of thermal background and temperature sensing means according to any of the embodiments of the device according to the present invention.

As the vehicle moves the copied visual structure 814' of the background will continuously be adapted to changes in the visual structure of the background due to the combination of a display surface and visual sensing means for registering visual structure according to any of the embodiments of the device according to the present invention.

The device according to the present invention consequently facilitates automatic thermal and visual adaptation and lower contrast to temperature varying and visual backgrounds, which renders detection, identification and recognition more difficult and reduces the threat posed from potential target seeking systems or similar.

The device according to the present invention facilitates a small radar cross section (RCS) of a vehicle i.e. an adaptation of radar signature by means of utilizing frequency selective and radar suppressive functionality. Wherein said adaptation can be maintained both when a vehicle is stationary and when in motion.

The device according to the present invention facilitates a low signature of a vehicle, i.e. low contrast, such that the contours of the vehicle, placement of exhaust outlet, placement and size of outlet of cooling air, track stand or wheels, canon turrets, etc., i.e. the signature of the vehicle may be thermally and visually minimized such that a lower thermal and visual signature against a background is provided by means of the device according to the present invention.

The device according to the present invention with a module system according to e.g. FIG. 11a-c offers an efficient layer of thermal isolation, which lowers the power consumption of e.g. AC-systems with lower affection of solar heating, i.e. when the device is not active the module system provides a good thermal isolation to solar heating of the vehicle and thereby improves the internal climate.

Figure 14:
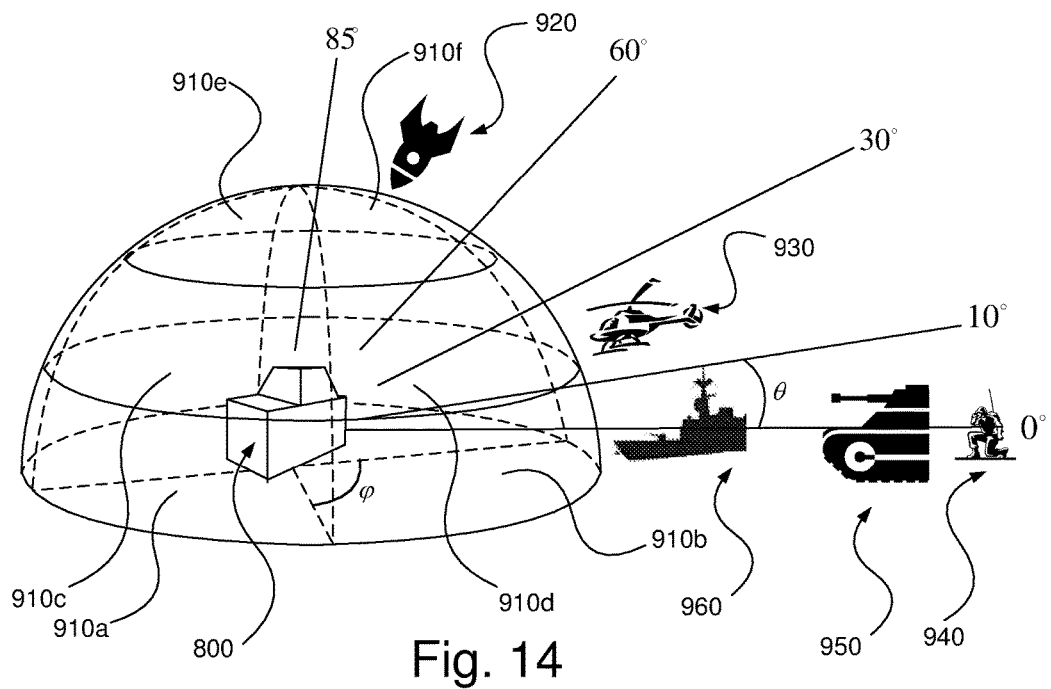
FIG. 14 schematically illustrates different potential directions of threat for an object such as a vehicle equipped with a device for recreating of the thermal and/or visual structure of a desired background.

FIG. 14 schematically illustrates different potential directions of threat for an object 800 such as a vehicle 800 equipped with a device according to an embodiment of the invention for recreation of the thermal and visual structure of a desired background as well for maintaining a low radar cross section.

According to an embodiment of the device according to the invention the device comprises means for selecting different direction of threats. The means according to an embodiment comprises a user interface e.g. as described in connection to FIG. 10. Depending on the expected direction of threat, the IR-signature and the visual signature will need to be adapted to different backgrounds. The user interface 630 in FIG. 10 according to an embodiment constitute a graphical means for the user to easily be able to select from an estimated direction of threat which part or parts of the vehicle that needs/need to be active in order to keep a low signature to the background.

By means of the user interface the operator may choose to focus available power of the device to achieve the best conceivable thermal/visual structure/signature, which e.g. may be required when the background is complicated and demanding much power of the device for an optimal thermal and visual adaptation in case the device comprises a display surface.

FIG. 14 shows different directions of threat for the object 800/vehicle 800, the directions of threat being illustrated by having the object/vehicle drawn in a semi-sphere divided into sections. The threat may be constituted by e.g. threat from above such as target seeking missile 920, helicopter 930, or the like or from the ground such as from soldier 940, tank 950, combat surface ship 960 or the like. If the threat comes from above the temperature of the vehicle and the visual structure should coincide with the temperature and visual structure of the ground, while it should be adapted to the background behind the vehicle should the threat be coming straight from the front in horizontal level. According to a variant of the invention a number of threat sectors 910a-f defined, e.g. twelve threat sectors, of which six 910a-f are referred to in FIG. 14 and an additional six are opposite of the semi-sphere, which may be selected by means of the user interface.

Above the device according to the present invention has been described where the device is utilized for adaptive thermal and visual camouflaging such that e.g. a vehicle during movement continuously by means of the device according to the invention quickly adapts itself thermally and visually to the background, the thermal structure of the background being copied by means of a thermal sensing means such as an IR-camera or an IR-sensor and the visual structure of the background being copied by means of a visual sensing means such as an camera/video camera.

The device according to the present invention may advantageously be used for generating directionally dependent visual structure for example by means of utilizing a display surface according to FIG. 7d-e, i.e. using a display surface that is capable of generating a reproduction of the visual structure of the background that is representative of the background observed from different observation angles, that falls outside an observation angle that is substantially orthogonal to the respective display surface of the module elements. As an example the device may reproduce a first visual structure that is representative of the background seen from a first observation angle, formed between a position of the helicopter 930 and a position of the vehicle 800 and a second visual structure that is representative of the background viewed from an observation angle, formed between a position of a soldier 940 or tank a 950 or a surface combat ship 960 and a position of the vehicle 800. This enables to reproduce background structure more realistically with correct perspectives viewed from different observation angles.

The device according to the present invention may advantageously be used for generating specific thermal and/or visual patterns. This is achieved according to a variant by regulating each thermoelectric element and/or at least one display surface of a module system built up of module elements e.g. as illustrated in FIG. 11a-c such that the module elements receives desired, e.g. different, temperature and/or radiates desired spectrum, any desired thermal and/or visual pattern may be provided. Hereby for example a pattern which only may be recognized by the one knowing its appearance may be provided such that in a war situation identification of own vehicles or corresponding is facilitated while the enemy are unable to identify the vehicle. Alternatively a pattern known by anyone may be provided by means of the device according to the invention, such as a cross so that everybody may identify an ambulance vehicle in the dark. Said specific pattern may for example be constituted by a unique fractal pattern. Said specific pattern may further be super positioned in the pattern that is desired to be generated for purpose of signature adaptation so that said specific pattern only is made visible for units of own forces that are provided with sensor means/decoding means.

By using the device according to the present invention to generate specific patterns efficient IFF system functionality ("Identification-Friend-or-Foe") is facilitated. Information relating to specific patterns may for example be stored in storage units associated to firing units of own forces so that sensor means/decoding means of said firing units perceives and decodes/identifies objects applied with said specific patterns and thereby are enabled to generate information the prevents firing.

According to yet another variant the device according to the present invention may be used for generating a fake signature of other vehicles for e.g. infiltration of the enemy. This is achieved by regulating each thermoelectric element and/or at least one display surface of a module system built up of module elements e.g. as illustrated in FIG. 11a-c such that the right contours of a vehicle, visual structures, evenly heated surfaces, cooling air outlet or other types of hot areas being unique for the vehicle in question are provided. Hereby information regarding this appearance is required.

According to yet a variant the device according to the present invention may be used for remote communication. This is achieved by that said specific patterns are associated to specific information that may be decoded using access to a decoding table/decoding means. This facilitates "silent" communication of information between units wherein radio waves that may be intercepted by opposing forces are rendered un-necessary for communication. For example status information relating to one or more of the following entities fuel supply, position of own forces, position of opposing forces, ammunition supply, etc. may be communicated.

Further, thermal patterns in the form of e.g. a collection of stones, grass and stone, different types of forest, urban environment (edgy and straight transitions) could be provided by means of the device according to the invention, which patterns could look like patterns being in the visible area. Such thermal patterns are independent of direction of threat and are relatively cheap and simple to integrate.

For the above mentioned integration of specific patterns according to a variant no thermal sensing means and/or visual sensing means is required, but is sufficient to regulate the thermoelectric elements and/or said display surfaces, i.e. apply voltage corresponding to desired temperature/spectrum for desired thermal/visual pattern of respective module.

By means of using the efficient signature adaptation a number of application areas are enabled for a device according to the present invention. As an example the device according to the present invention may advantageously be used for de-icing of objects onto which said device is arranged to be applied. De-icing may be performed by means of that the device according to the invention has the opportunity to control the outer temperature of the object, whereby the temperature of the outer surface facing the surroundings can be controlled such that ice accretion effectively can be countered and that layers of ice already accreted may be removed.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

The invention claimed is:

1. A device for signature adaptation, comprising:
   a surface element arranged to assume a determined thermal distribution, wherein said surface element comprises a plurality of temperature generating elements, each having an outer portion arranged to generate a predetermined temperature gradient to a portion of a plurality of portions of a first heat conducting layer of said surface element; and
   a liquid cooling element arranged to provide at least one liquid flow, thermally contacting an inner portion of each of the temperature generating elements so that thermal energy is dispersed from the inner portion of each of the temperature generating elements in order to generate the predetermined temperature gradient to the portion of the plurality of portions of the first heat conducting layer, further wherein:
   the liquid cooling element comprises a liquid cooling element layer, inwardly of the first heat conducting layer,
   the liquid cooling element layer comprises a plurality of apertures arranged to receive the plurality of temperature generating elements so that the plurality of temperature generating elements thermally contacts a portion of a heat plate structure, and
   the heat plate structure is arranged inwardly of and facing the liquid cooling element layer and arranged to disperse the thermal energy from the plurality of temperature generating elements in a direction along the surface of the heat plate structure.

2. The device of claim 1, wherein said liquid cooling element is configured for coupling to at least one pump arranged to provide at least one liquid flow to said liquid cooling element.

3. The device of claim 1, wherein said liquid cooling element comprises a liquid cooling plate and wherein said liquid cooling plate is arranged to be applied thermally contacting a portion of said heat plate structure.

4. The device of claim 1, wherein said plurality of apertures of the liquid cooling element layer are arranged in a geometrical pattern in a form of a plurality of column and wherein said heat plate structure comprises a plurality of heat plates, arranged to be applied to the liquid cooling element layer so that each of the heat plates overlaps a column of said plurality of column of apertures of the liquid cooling element layer.

5. The device of claim 4, wherein the heat plate structure comprises a transversal heat plate arranged to thermally contact a central portion of each of said plurality of heat plates and wherein said liquid cooling plate is arranged to be arranged facing said transversal heat plate.

6. The device of claim 2, wherein said liquid cooling element is configured for coupling to said at least one pump via at least one conduit arranged for transport of said at least one liquid flow.

7. The device of claim 2, wherein said at least one liquid flow comprises at least one cooling medium.

8. The device of claim 7, wherein said at least one cooling medium comprises water.

9. The device of claim 1, wherein said liquid cooling element is arranged to be supplied with said at least one liquid flow from at least one reservoir comprising cooling medium.

10. The device of claim 9, wherein said at least one reservoir is comprised of ocean- or sea-water.

11. The device of claim 1, wherein said surface element comprises at least one display surface arranged to radiate at least one predetermined spectrum.

12. The device of claim 11, wherein said at least one display surface comprises a plurality of display sub-surfaces, wherein said display sub-surfaces are arranged to radiate at least one predetermined spectrum in at least one predetermined direction, wherein said at least one predetermined spectrum is directional dependent.

13. The device of claim 12, wherein said at least one predetermined direction for each display sub-surface is individually displaced relative to an orthogonal axis of said display surface.

14. The device of claim 12, wherein said at least one display surface comprises an obstructing layer arranged to obstruct incident light of selected angles of incidence and an underlying curved reflecting layer arranged to reflect incident light.

15. The device of claim 1, wherein the surface element comprises at least one additional element arranged to provide radar suppression.

16. The device of claim 1, wherein said surface element comprises at least one additional element arranged to provide armour.

17. The device of claim 1, wherein said first heat conducting layer has anisotropic heat conductibility such that heat conduction mainly occurs in the main direction of propagation of the layer.

18. The device of claim 1, wherein the surface element comprises an intermediate heat conducting element arranged inwardly of and facing the temperature generating element, wherein the intermediate heat conducting element has anisotropic heat conductibility such that heat conduction mainly occurs crosswise to the main direction of propagation of the first heat conducting layer.

19. The device of claim 1, wherein the surface element has a hexagonal shape.

20. The device of claim 1, further comprising a thermal sensor arranged to sense surrounding temperature, e.g. thermal background.

21. The device of claim 2, further comprising a visual sensor arranged to sense the visual background of the surrounding.

22. The device of claim 1, wherein the device comprises a plurality of surface elements, wherein the liquid cooling element of each of said surface element is coupled in parallel, to at least one conduit for inflow of said at least one liquid flow and to at least one conduit for inflow of said at least one liquid flow.

23. The device of claim 1, wherein the device comprises a framework or support structure, wherein the framework or support structure is arranged to support a plurality of interconnected surface elements and to provide current and control signals/communication to said plurality of interconnected surface elements.

24. A marine craft, comprising a device according to claim 1.

* * * * *